(12) United States Patent
Hirano et al.

(10) Patent No.: US 10,514,601 B2
(45) Date of Patent: Dec. 24, 2019

(54) CHEMICALLY AMPLIFIED POSITIVE RESIST FILM LAMINATE AND PATTERN FORMING PROCESS

(71) Applicant: Shin-Etsu Chemical Co., Ltd., Tokyo (JP)

(72) Inventors: Yoshinori Hirano, Annaka (JP); Satoshi Asai, Annaka (JP); Kazunori Kondo, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 67 days.

(21) Appl. No.: 15/819,532

(22) Filed: Nov. 21, 2017

(65) Prior Publication Data

US 2018/0143535 A1  May 24, 2018

(30) Foreign Application Priority Data

Nov. 24, 2016 (JP) .................................. 2016-227532

(51) Int. Cl.
| | |
|---|---|
| G03F 7/039 | (2006.01) |
| G03F 7/11 | (2006.01) |
| G03F 7/09 | (2006.01) |
| G03F 7/16 | (2006.01) |
| G03F 7/20 | (2006.01) |
| G03F 7/30 | (2006.01) |

(52) U.S. Cl.
CPC ............ *G03F 7/0392* (2013.01); *G03F 7/094* (2013.01); *G03F 7/11* (2013.01); *G03F 7/161* (2013.01); *G03F 7/20* (2013.01); *G03F 7/30* (2013.01)

(58) Field of Classification Search
CPC . G03F 7/11; G03F 7/094; G03F 7/161; G03F 7/40; G03F 7/0392; G03F 7/0397; G03F 7/30; G03F 7/20

USPC ............................................. 430/271.1, 277.1
See application file for complete search history.

(56) References Cited

U.S. PATENT DOCUMENTS

| | | | |
|---|---|---|---|
| 4,764,449 A * | 8/1988 | Vanlseghem ............ B24C 1/04 | 430/162 |
| 5,594,044 A * | 1/1997 | Yang ........................ B41J 2/01 | 106/31.05 |
| 6,884,570 B2 * | 4/2005 | Imai et al. ............. G03F 7/039 | 430/277.1 |
| 8,980,525 B2 | 3/2015 | Yasuda et al. | |
| 9,519,217 B2 | 12/2016 | Takemura et al. | |
| 2002/0068236 A1 * | 6/2002 | Imai ....................... G03F 7/0045 | 430/258 |
| 2004/0081921 A1 * | 4/2004 | Yamashita ............. B82Y 10/00 | 430/322 |
| 2016/0070170 A1 | 3/2016 | Hirano et al. | |

FOREIGN PATENT DOCUMENTS

| | | |
|---|---|---|
| EP | 2 551 722 A1 | 1/2013 |
| EP | 2 955 576 A1 | 12/2015 |
| EP | 2 993 521 A1 | 3/2016 |
| JP | 2013-47786 A | 3/2013 |
| JP | 2015-232607 A | 12/2015 |
| JP | 2016-57612 A | 4/2016 |

* cited by examiner

*Primary Examiner* — Cynthia Hamilton
(74) *Attorney, Agent, or Firm* — Westerman, Hattori, Daniels & Adrian, LLP

(57) ABSTRACT

A laminate comprising a thermoplastic film and a chemically amplified positive resist film thereon is provided, the resist film comprising (A) a base polymer having a hydroxyphenyl group and a protective group, the polymer turning alkali soluble as a result of the protective group being eliminated under the action of acid, (B) a photoacid generator, (C) an organic solvent, and (D) a polymer having an ester bond in its backbone. The resist film may be transferred to a stepped support without forming voids.

7 Claims, 1 Drawing Sheet

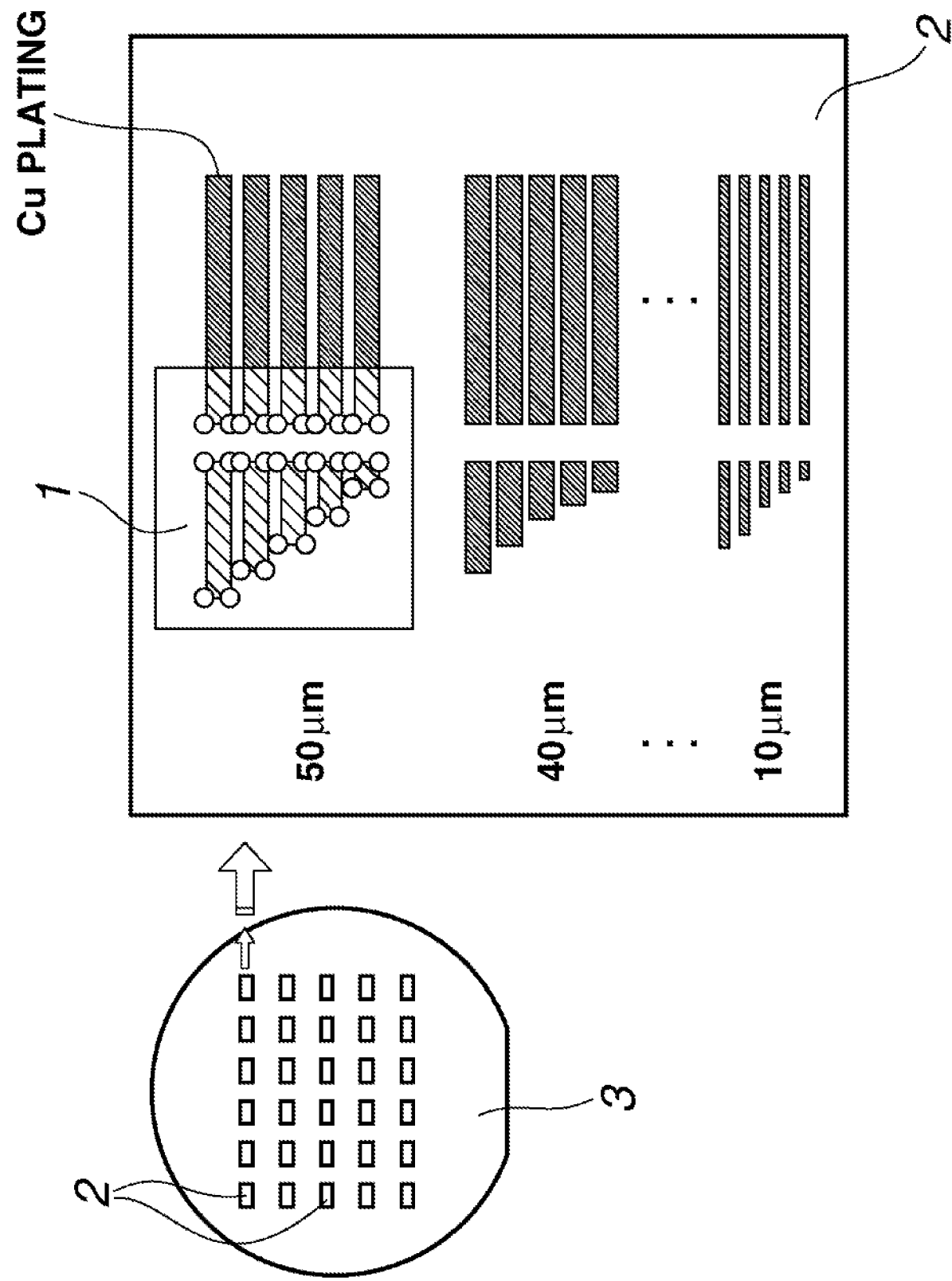

CHEMICALLY AMPLIFIED POSITIVE RESIST FILM LAMINATE AND PATTERN FORMING PROCESS

CROSS-REFERENCE TO RELATED APPLICATION

This non-provisional application claims priority under 35 U.S.C. § 119(a) on Patent Application No. 2016-227532 filed in Japan on Nov. 24, 2016, the entire contents of which are hereby incorporated by reference.

TECHNICAL FIELD

This invention relates to a chemically amplified positive resist film laminate and a pattern forming process.

BACKGROUND ART

While progress is now made toward microelectronic devices of higher integration density, multi-pin thin-layer packages are used. For the manufacture of multi-pin structures, the technology for forming bump electrodes with a height of 10 to 100 μm or more as the connecting terminal is necessary. When electrodes are formed by electroplating, a chemically amplified positive photoresist composition is often used because a high sensitivity and high resolution are rather readily achievable and stripping of a photoresist film after plating is easy.

When a resist pattern is formed on a copper substrate, however, many resist materials give rise to the so-called footing phenomenon that a thin resist layer is left at the interface with the substrate. For example, Patent Document 1 discloses the addition of a benzotriazole compound to a resist material, which forms a pattern of improved profile on the Cu substrate. Patent Document 2 describes that a polymer comprising recurring units of polyacrylate is incorporated in order to improve the solubility of a thick film. Additionally, the developing time is shortened. These compositions, however, are liquid compositions which are often applied onto supports by spin coating. Under certain coating conditions, floating matter known as cotton candy generates to contaminate the surrounding of the system. When the support has steps on its surface, bubbles known as voids form.

Only a few reports including Patent Document 3 refer to chemically amplified positive resist film laminates. There is the problem that when the resist film is transferred to another support, voids form as in the case of liquid resist compositions if the support has steps. There is the demand for a chemically amplified positive resist film laminate which eliminates the void problem when the resist film is transferred to a stepped support.

CITATION LIST

Patent Document 1: JP-A 2013-047786 (U.S. Pat. No. 8,980,525, EP 2551722)
Patent Document 2: JP-A 2015-232607 (U.S. Pat. No. 9,519,217, EP 2955576)
Patent Document 3: JP-A 2016-057612 (USP 20160070170, EP 2993521)

SUMMARY OF INVENTION

An object of the invention is to provide a chemically amplified positive resist film laminate which ensures that the chemically amplified positive resist film is transferred to a stepped support without forming voids, and a pattern forming process.

The inventors have found that the above and other objects are achieved by a chemically amplified positive resist film laminate comprising a thermoplastic film and a chemically amplified positive resist film comprising a polymer having a hydroxyphenyl group and a protective group on side chain, adapted to turn alkali soluble as a result of the protective group being eliminated under the action of acid, a photoacid generator, an organic solvent, and an ester bond-containing backbone polymer having a Mw of 700 to 50,000.

In one aspect, the invention provides a chemically amplified positive resist film laminate comprising a thermoplastic film and a chemically amplified positive resist film thereon, the chemically amplified positive resist film comprising (A) a base resin comprising a polymer having a hydroxyphenyl group and a protective group on side chain, the polymer turning alkali soluble as a result of the protective group being eliminated under the action of acid, (B) a photoacid generator, (C) 3 to 30% by weight of an organic solvent, and (D) a polymer having an ester bond in its backbone, the resist film being able to be transferred to another support.

In one preferred embodiment, component (D) is the condensation reaction product of a polyfunctional carboxylic acid with a polyhydric alcohol. More preferably, the polyfunctional carboxylic acid is an aliphatic carboxylic acid.

In one preferred embodiment, the resist film has a thickness of 5 to 250 μm.

In another aspect, the invention provides a pattern forming process comprising the steps of (1) transferring the chemically amplified positive resist film of the laminate of any one of claims 1 to 4 to another support, (2) exposing the resist film to radiation of wavelength 230 to 500 nm, (3) developing the resist film in an aqueous alkaline solution, and optionally (4) forming a metal plating on the support by electroplating or electroless plating, subsequent to step (3).

ADVANTAGEOUS EFFECTS OF INVENTION

The chemically amplified positive resist film laminate of the invention ensures that the chemically amplified positive resist film is transferred to a stepped support without forming voids.

BRIEF DESCRIPTION OF DRAWINGS

FIG. 1 illustrates resist patterns, depicting an area where cracks are observed in Example 11.

DESCRIPTION OF EMBODIMENTS

The term "a" and "an" herein do not denote a limitation of quantity, but rather denote the presence of at least one of the referenced item. "Optional" or "optionally" means that the subsequently described event or circumstance may or may not occur, and that the description includes instances where the event occurs and instances where it does not. As used herein, the notation ($C_n$-$C_m$) means a group containing from n to m carbon atoms per group.

The abbreviations and acronyms have the following meaning.

UV: ultraviolet radiation
EB: electron beam
Mw: weight average molecular weight
Mw/Mn: molecular weight distribution or dispersity GPC: gel permeation chromatography
PEB: post-exposure baking
PAG: photoacid generator Resist Film Laminate The chemically amplified positive resist film laminate is defined as comprising a thermoplastic film and a chemically amplified positive resist film thereon which can be transferred to another support.

Thermoplastic Film

The thermoplastic film serves as a parting substrate and is not particularly limited as long as it does not adversely affect the shape or morphology of the resist film and can be separated from the resist film. The film may be a monolayer film in the form of a single polymer film or a multilayer film consisting of a plurality of polymer layers. Use may be made of any plastic films including nylon film, polyethylene (PE) film, polyethylene terephthalate (PET) film, polyethylene naphthalate film, polyphenylene sulfide (PPS) film, polypropylene (PP) film, polystyrene film, polymethylpentene (TPX) film, polycarbonate film, fluoro-resin film, special polyvinyl alcohol (PVA) film, and polyester film which is treated with a parting agent.

Among others, PET and PP films are preferred as the thermoplastic film because of appropriate flexibility, mechanical strength and heat resistance. The films may have been subjected to various treatments such as corona treatment and coating of parting agent. Useful films are commercially available, for example, Cerapeel WZ(RX) and Cerapeel BX8(R) from Toray Advanced Film Co., Ltd., E7302 and E7304 from Toyobo Co., Ltd., Purex G31 and Purex G71T1 from Dupont-Teijin Film Co., Ltd., PET38×1-A3, PET38×1-V8 and PET38×1-X08 from Nippa Corp. As used herein, the term "thermoplastic" means the nature that the film is flexible at normal temperature and pressure and does not crack even when deformed.

Chemically Amplified Positive Resist Film

The chemically amplified positive resist film comprising (A) a base resin comprising a polymer having a hydroxyphenyl group and a protective group on side chain, the polymer turning alkali soluble as a result of the protective group being eliminated under the action of acid, (B) a photoacid generator, (C) 3 to 30% by weight of an organic solvent, and (D) a polymer having an ester bond in its backbone.

(A) Base Resin

The base resin as component (A) contains a polymer having a hydroxyphenyl group and a protective group on side chain, the polymer turning alkali soluble as a result of the protective group being eliminated under the action of acid, referred to as Polymer A, hereinafter. For example, Polymer A is a polymer comprising recurring units derived from hydroxystyrene or derivative thereof wherein some hydrogen atoms of phenolic hydroxyl groups are substituted by acid labile groups. Preferably, Polymer A is a polymer comprising recurring units having the formula (1-1) and recurring units having the formula (1-2).

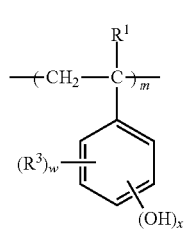

(1-1)

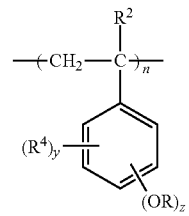

(1-2)

Herein, $R^1$ and $R^2$ are each independently hydrogen, hydroxyl, a $C_1$-$C_6$ straight or branched alkyl group, halogen, or trifluoromethyl group. $R^3$ is halogen or a $C_1$-$C_8$ straight, branched or cyclic alkyl group. Where two or more groups $R^3$ are present, they may be identical or different. $R^4$ is hydroxyl, halogen or a $C_1$-$C_8$ straight, branched or cyclic alkyl group. Where two or more groups $R^4$ are present, they may be identical or different. The subscripts m and n are numbers in the range: $0 \leq m < 1$, $0 < n \leq 1$, and $0 < m+n \leq 1$, preferably $0 < m < 1$ and $0 < n < 1$, more preferably $0.3 \leq m \leq 0.9$ and $0.1 \leq n \leq 0.7$, and even more preferably $0.5 \leq m \leq 0.8$ and $0.2 \leq n \leq 0.5$.

In the formulae, w and x are integers in the range: $0 \leq w \leq 4$, $1 \leq x \leq 5$, and $w+x \leq 5$, preferably $0 \leq w \leq 2$ and $1 \leq x \leq 2$; y and z are integers in the range: $0 \leq y \leq 4$, $1 \leq z \leq 5$, and $y+z \leq 5$, preferably $0 \leq y \leq 2$ and $1 \leq z \leq 2$.

Examples of the $C_1$-$C_8$ alkyl group include methyl, ethyl, n-propyl, isopropyl, n-butyl, isobutyl, sec-butyl, tert-butyl, n-pentyl, isopentyl, tert-pentyl, n-hexyl, and n-heptyl. Inter alia, methyl, ethyl, n-propyl and isopropyl are preferred. One or more or even all hydrogen atom on the alkyl group may be substituted by halogen atoms such as fluorine, and such halo-substituted alkyl groups include fluoromethyl, difluoromethyl, trifluoromethyl, 2,2,2-trifluoroethyl, and pentafluoroethyl.

In formula (1-2), R is an acid labile group. The acid labile group is selected from a variety of such groups, preferably from groups of the formula (2-1), groups of the formula (2-2), groups of the formula (2-3), shown below, trialkylsilyl groups, and ketoalkyl groups.

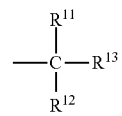

(2-1)

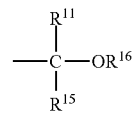

(2-2)

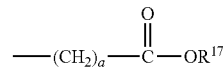

(2-3)

In formula (2-1), $R^{11}$ to $R^{13}$ are each independently a $C_1$-$C_8$ straight, branched or cyclic alkyl group. A pair of $R^{11}$ and $R^{12}$, $R^{11}$ and $R^{13}$, or $R^{12}$ and $R^{13}$ may bond together to form a ring with the carbon atom to which they are attached. Each participant of $R^{11}$, $R^{12}$ and $R^{13}$ is independently a $C_1$-$C_{16}$ straight or branched alkylene group when they form a ring.

In formula (2-2), $R^{14}$ and $R^{15}$ are each independently hydrogen or a $C_1$-$C_8$ straight or branched alkyl group. $R^{16}$ is a $C_1$-$C_{10}$ straight, branched or cyclic alkyl group. A pair of $R^{14}$ and $R^{15}$, $R^{14}$ and $R^{16}$, or $R^{15}$ and $R^{16}$ may bond together to form a ring with the carbon atom or the carbon and oxygen atoms to which they are attached. Each participant of $R^{14}$, $R^{15}$ and $R^{16}$ is independently a $C_1$-$C_6$ straight or branched alkylene group when they form a ring.

In formula (2-3), $R^{17}$ is a $C_4$-$C_{40}$ tertiary alkyl group, and a is an integer of 0 to 6.

Examples of the $C_1$-$C_8$ alkyl group are as exemplified above. The $C_4$-$C_{40}$ tertiary alkyl groups are preferably those of 4 to 12 carbon atoms, more preferably 4 to 8 carbon atoms, and even more preferably 4 to 6 carbon atoms, specifically tert-butyl, tert-pentyl and tert-hexyl.

Examples of the group having formula (2-1) include tert-butyl, tert-pentyl and 1-methylcyclohexyl.

Examples of the group having formula (2-2) include 1-methoxyethyl, 1-ethoxyethyl, 1-n-propoxyethyl, 1-iso-propoxyethyl, 1-n-butoxyethyl, 1-isobutoxyethyl, 1-sec-bu-toxyethyl, 1-tert-butoxyethyl, 1-tert-pentyloxyethyl, 1-methoxy-1-propyl, 1-ethoxy-1-propyl, 2-methoxy-2-pro-pyl, 2-ethoxy-2-propyl, 1-cyclohexyloxyethyl, tetrahydro-pyranyl, and tetrahydrofuranyl. Inter alia, 1-ethoxyethyl and 1-ethoxy-1-propyl are preferred.

Examples of the group having formula (2-3) include tert-butoxycarbonyl, tert-butoxycarbonylmethyl, tert-penty-loxycarbonyl, 1-methylcyclopentyloxycarbonyl, 1-ethylcy-clopentyloxycarbonyl, 1-ethylcyclohexyloxycarbonyl, and tert-pentyloxycarbonylmethyl.

Suitable trialkylsilyl groups include those wherein each alkyl moiety has 1 to 6 carbon atoms, such as trimethylsilyl, triethylsilyl and dimethyl-tert-butylsilyl. Suitable ketoalkyl groups include 3-oxocyclohexyl and groups of the following formulae.

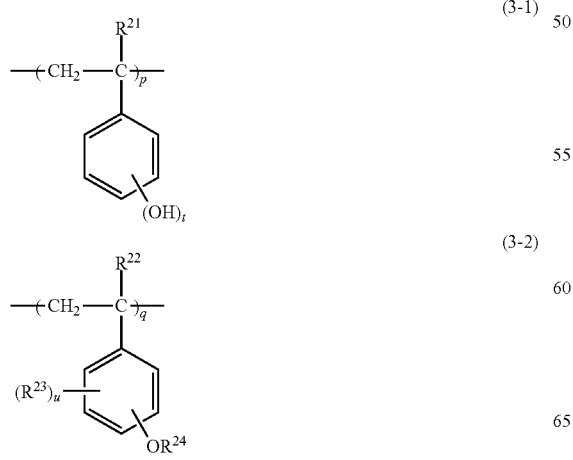

A more preferred embodiment of Polymer A is a polymer comprising recurring units having formulae (3-1) to (3-4).

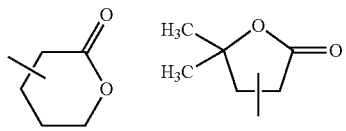

(3-1)

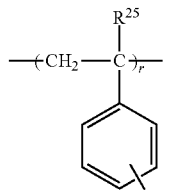

(3-2)

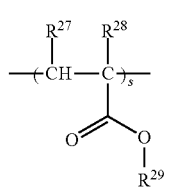

(3-3)

(3-4)

Herein $R^{21}$, $R^{22}$ and $R^{25}$ are each independently hydrogen, hydroxyl, a $C_1$-$C_6$ straight or branched alkyl group, halogen, or trifluoromethyl group.

$R^{23}$ is a group of at least one type selected from hydroxyl, halogen and trifluoromethyl. Where two or more groups $R^{23}$ are present (i.e., u is at least 2), they may be identical or different. $R^{24}$ is an acid labile group. The acid labile group represented by $R^{24}$ is as exemplified above for R, and preferably a group of formula (2-1) or a group of formula (2-2).

$R^{26}$ is hydrogen, a $C_1$-$C_{12}$ alkyl group which may be substituted with fluorine, a $C_1$-$C_{12}$ primary or secondary alkoxy group which may be substituted with fluorine, —C(CF$_3$)$_2$—OH, or a trialkylsilyl group in which each alkyl moiety has 1 to 6 carbon atoms. $R^{27}$ is hydrogen or methyl. $R^{28}$ is hydrogen, methyl, $C_2$-$C_6$ alkoxycarbonyl, cyano, halogen or trifluoromethyl. $R^{29}$ is a substituted or unsubstituted $C_4$-$C_{30}$ straight, branched or cyclic alkyl group.

Of the foregoing groups, suitable alkyl groups are as exemplified above. Suitable halogen atoms include fluorine, chlorine and bromine atoms. Suitable $C_1$-$C_{12}$ alkoxy groups include methoxy, ethoxy, n-propoxy, isopropoxy, n-butoxy, isobutoxy, sec-butoxy, n-pentyloxy, cyclopentyloxy, n-hexy-loxy, cyclohexyloxy, cyclooctyloxy, and cyclononyloxy.

When $R^{29}$ is a tertiary alkyl group, a group having the formula (4-1) or (4-2) is preferred.

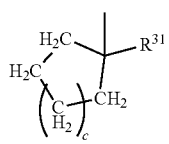

(4-1)

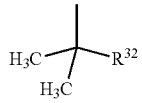

(4-2)

Herein $R^{31}$ is methyl, ethyl, isopropyl, cyclohexyl, cyclo-pentyl, vinyl, acetyl, phenyl, benzyl or cyano; e is an integer of 0 to 3: and $R^{32}$ is methyl, ethyl, isopropyl, cyclohexyl, cyclopentyl, vinyl, phenyl, benzyl or cyano.

The group having formula (4-1) is preferably a 5- or 6-membered ring. Examples include 1-methylcyclopentyl, 1-ethylcyclopentyl, 1-isopropylcyclopentyl, 1-vinylcyclo-pentyl, 1-acetylcyclopentyl, 1-phenylcyclopentyl, 1-cyanocyclopentyl, 1-methylcyclohexyl, 1-ethylcyclohexyl, 1-isopropylcyclohexyl, 1-vinylcyclohexyl, 1-acetylcyclohexyl, 1-phenylcyclohexyl, and 1-cyanocyclohexyl.

Examples of the group having formula (4-2) include tert-butyl, 1-vinyldimethylmethyl, 1-benzyldimethylmethyl, 1-phenyldimethylmethyl, and 1-cyanodimethylmethyl.

The cyclic tertiary alkyl groups shown below are also preferred examples of $R^{29}$.

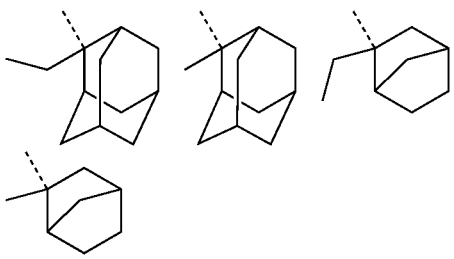

Herein the broken line designates a valence bond.

In formula (3-1), t is an integer of 0 to 5, preferably 0 to 2. In formula (3-2), u is an integer of 0 to 4, preferably 0 to 2.

In formulae (3-1) to (3-4), p, q, r and s are numbers satisfying $0 \leq p < 1$, $0 < q \leq 1$, $0 \leq r < 1$, $0 \leq s < 1$, and $p+q+r+s=1$; preferably $0.2 \leq p \leq 0.8$, $0.1 \leq q \leq 0.8$, $0 \leq r \leq 0.35$, and $0 \leq s \leq 50.35$; more preferably $0.25 \leq p \leq 0.75$, $0.1 \leq q \leq 0.45$, $0 \leq r \leq 0.35$, and $0.05 \leq s \leq 0.3$. A proper choice of values of p, q, r and s from the ranges enables to control the dissolution contrast and dissolution rate of a resist film and hence, to control the size and profile of a resist pattern.

The condition under which the chemically amplified positive resist film has a high sensitivity and the development time is shortened corresponds to formula (3-4) wherein s is not equal to 0. The acid labile group with which the phenolic hydroxyl group is protected is eliminated to form an alkali soluble functional group, which is a phenolic hydroxyl group. When the rate of dissolution in alkaline developer is compared between phenolic hydroxyl group and —COOH group, the dissolution rate of —COOH group is overwhelmingly high. Then the chemically amplified positive resist film using a base resin comprising recurring units having formula (3-4) is effective for achieving a high sensitivity and a short development time.

Polymer A should preferably have a Mw of 1,000 to 500.000, more preferably 2,000 to 30,000, as measured by GPC versus polystyrene standards using tetrahydrofuran solvent. This range of Mw ensures heat resistance and sufficient alkaline solubility, avoiding a footing phenomenon after pattern formation.

With respect to the recurring units having formulae (1-1) and (1-2) and the recurring units having formulae (3-1) to (3-4), units of only one type or plural types may be contained in the molecule.

Polymer A may be used alone or in a combination of two or more.

In addition to Polymer A, the base resin may contain an acrylic resin component comprising recurring units which are derived from a (meth)acrylate and have an acid labile group on side chain. The preferred resin is a polymer comprising recurring units of the formula (5) and having a Mw of 1.000 to 500,000.

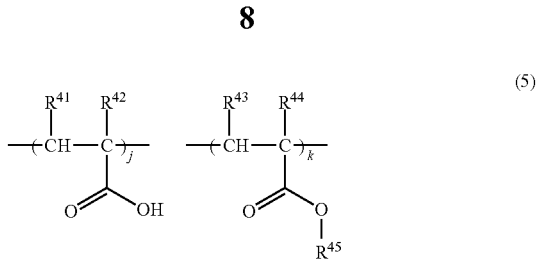

Herein $R^{41}$ and $R^{43}$ are each independently hydrogen or methyl; $R^{42}$ and $R^{44}$ are each independently hydrogen, methyl, $C_2$-$C_6$ alkoxycarbonyl, cyano, halogen, or trifluoromethyl; $R^{45}$ is a substituted or unsubstituted $C_1$-$C_{30}$ straight or branched alkyl group. $C_4$-$C_{30}$ cycloalkyl group, $C_4$-$C_{30}$ lactone ring-containing group, or $C_1$-$C_{24}$ monovalent organic group containing oxygen, sulfur or nitrogen; j and k are numbers satisfying $0 \leq j < 1$, $0 < k \leq 1$, and $j+k=1$.

An amount of the acrylic resin component used is 0 to 100 parts by weight per 100 parts by weight of Polymer A. and when used, preferably 5 to 50 parts by weight. The acrylic resin component may be used alone or in a combination of two or more.

(B) Photoacid Generator

The PAG as component (B) is not particularly limited as long as it is a compound capable of generating an acid upon exposure to high-energy radiation. Examples of high-energy radiation include UV, deep-UV and EB, specifically g-line, h-line, i-line, KrF excimer laser, ArF excimer laser, EB, and synchrotron radiation.

Preferred PAGs are sulfonium salts, iodonium salts, sulfonyldiazomethane, N-sulfonyloxynimide, benzoin sulfonate, pyrogallol trisulfonate, nitrobenzyl sulfonate, sulfone, and O-arylsulfonyloxime or O-alkylsulfonyloxime (oxime sulfonate) acid generators.

Sulfonium salts are salts of sulfonium cations with sulfonate anions. Exemplary sulfonium cations include triphenylsulfonium, (4-tert-butoxyphenyl)diphenylsulfonium, bis(4-tert-butoxyphenyl)phenylsulfonium, tris(4-tert-butoxyphenyl)sulfonium, (3-tert-butoxyphenyl)diphenylsulfonium, bis(3-tert-butoxyphenyl)phenylsulfonium, tris(3-tert-butoxyphenyl)sulfonium, (3,4-di-tert-butoxyphenyl)diphenylsulfonium, bis(3,4-di-tert-butoxyphenyl)phenylsulfonium, tris(3,4-di-tert-butoxyphenyl)sulfonium, diphenyl(4-thiophenoxyphenyl)sulfonium, (4-tert-butoxycarbonylmethyloxyphenyl)diphenylsulfonium, tris(4-tert-butoxycarbonylmethyloxyphenyl)sulfonium, (4-tert-butoxyphenyl)bis(4-dimethylaminophenyl)sulfonium, tris(4-dimethylaminophenyl)sulfonium, 2-naphthyldiphenylsulfonium, dimethyl-2-naphthylsulfonium, 4-hydroxypheuyldimethylsulfonium, 4-methoxyphenyldimethylsdlfonium, trimethylsulfonium, 2-oxocyclohexylcyclohexylmethylsulfonium, trinaphthylsulfonium, and tribenzylsulfonium. Exemplary sulfonate anions include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, 4-(4-toluenesulfonyloxy)benzenesulfonate, naphthalenesulfonate, camphorsulfonate, octanesulfonate, dodecylbenzenesulfonate, butanesulfonate, and methanesulfonate. Sulfonium salts based on combination of the foregoing examples are included.

Iodonium salts are salts of iodonium cations with sulfonate anions. Exemplary iodonium cations are aryliodonium cations including diphenyliodonium, bis(4-tert-butylphenyl)iodonium, 4-tert-butoxyphenylphenyliodonium, and 4-methoxyphenylphenyliodonium. Exemplary sulfonate anions include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, 4-(4-toluenesulfonyloxy)benzenesulfonate, naphthalenesulfonate, camphorsulfonate, octanesulfonate, dodecylbenzenesulfonate, butanesulfonate, and methanesulfonate. Iodonium salts based on combination of the foregoing examples are included.

Exemplary sulfonyldiazomethane compounds include bissulfonyldiazomethane compounds and sulfonyl-carbonyldiazomethane compounds such as bis(ethylsulfonyl)diazomethane, bis(1 1-methylpropylsulfonyl)diazomethane, bis(2-methylpropylsulfonyl)diazomethane, bis(1,1-dimethylethylsulfonyl)diazomethane, bis(cyclohexylsulfonyl)diazomethane, bis(pertluoroisopropylsulfonyl)diazomethane, bis(phenylsulfonyl)diazomethane, bis(4-methylphenylsulfonyl)diazomethane, bis(2,4-dimethylphenylsulfonyl)diazomethane, bis(2-naphthylsulfonyl)diazomethane, 4-methylpheuylsulfonylbenzoyldiazomethane, tert-butylcarbonyl-4-methylphenylsulfonyldiazomethane, 2-naphthylsulfonylbenzoyldiazomethane, 4-methylphenylsulfonyl-2-naphthoyldiazomethane, methylsulfonylbenzoyldiazomethane, and tert-butoxycarbonyl-4-methylphenylsulfonyldiazomethane.

N-sulfonyloxyimide PAGs include imide compounds having nitrogen-bonded to hydrogen replaced by a sulfonyloxy group. Exemplary imide skeletons include succinimide, naphthalene dicarboxylic acid imide, phthalimide, cyclohexyldicarboxylic acid imide, 5-norbornene-2,3-dicarboxylic acid imide, and 7-oxabicyclo[2.2.1]-5-heptene-2,3-dicarboxylic acid imide. Exemplary sulfonyloxy groups include trifluoromethanesulfonyloxy, nonafluorobutanesulfonyloxy heptadecafluorooctanesulfonyloxy, 2,2,2-trifluoroethanesulfonyloxy, pentafluorobenzenesulfonyloxy, 4-trifluoromethylbenzenesulfonyloxy, 4-fluorobenzenesulfonyloxy, toluenesulfonyloxy, benzenesulfonyloxy, naphthalenesulfonyloxy, camphorsulfonyloxy, octanesulfonyloxy, dodecylbenzenesulfonyloxy, butanesulfonyloxy, and methanesulfonyloxy.

Benzoinsulfonate PAGs include benzoin tosylate, benzoin mesylate, and benzoin butanesulfonate.

Pyrogallol trisulfonate PAGs include pyrogallol, phloroglucinol, catechol, resorcinol, and hydroquinone, in which all hydroxyl groups are replaced by sulfonyloxy groups such as trifluoromethanesulfonyloxy, nonafluorobutanesulfonyloxy, heptadecafluorooctanesulfonyloxy, 2,2,2-trifluoroethanesulfonyloxy, pentafluorobenuzenesulfonyloxy, 4-trifluoromethylbenzenesulfonyloxy, 4-fluorobenzenesulfonyloxy, toluenesulfonyloxy, benzenesulfonyloxy, naphthalenesulfonyloxy, camphorsulfonyloxy, octanesulfonyloxy, dodecylbenzenesulfonyloxy, butanesulfonyloxy, and methanesulfonyloxy.

Nitrobenzyl sulfonate PAGs include 2,4-dinitrobenzyl sulfonate, 2-nitrobenzyl sulfonate, and 2,6-dinitrobenzyl sulfonate, with exemplary sulfonates including trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate. Also useful are analogous nitrobenzyl sulfonate compounds in which the nitro group is replaced by trifluoromethyl.

Sulfone PAGs include bis(phenylsulfonyl)methane, bis(4-methylphenylsulfonyl)methane, bis(Z-naphthylsulfonyl)methane, 2,2-bis(phenylsulfonyl)propane, 2,2-bis(4-methylphenylsulfonyl)propane, 2,2-bis(2-naphthylsulfonyl) propane, 2-methyl-2-(p-toluenesulfonyl)propiophenone, 2-cyclohexylcabonyl-2-(p-toluenesulfonyl)propane, and 2,4-dimethyl-2-(p-toluenesulfonyl)pentan-3-one.

Suitable O-arylsulfonyloxime or O-alkylsulfonyloxime (oxime sulfonate) PAGs include glyoxime derivatives, oxime sulfonates with a long conjugated system separated by thiophene or cyclohexadiene, oxime sulfonates having an electron withdrawing group such as trifluoromethyl incorporated for increased stability, oxime sulfonates using substituted acetonitrile derivatives such as phenylacetonitrile, and bisoxime sulfonates.

Glyoxime derivative PAGs include bis-O-(p-toluenesulfonyl)-α-dimethylglyoxime, bis-O-(p-toluenesulfonyl)-α-diphenylglyoxime, bis-O-(p-toluenesulfonyl)-α-dicyclohexylglyoxime, bis-O-(p-toluenesulfonyl)-2,3-pentanedioneglyoxime, bis-O-(n-butanesulfonyl)-α-dimethylglyoxime, bis-O-(n-butanesulfonyl)-α-diphenyiglyoxime, bis-O-(n-butanesulfonyl)-α-dicyclohexylglyoxime, bis-O-(methanesulfonyl)-α-dimethylglyoxime, bis-O-(trifluoromethanesulfonyl)-α-dimethylglyoxime, bis-O-(2,2,2-trifluoroethanesulfonyl)-α-dimethylglyoxime, bis-O-(10-camphorsulfonyl)-α-dimethylglyoxime, bis-O-(benzenesulfonyl)-α-dimethylglyoxime, bis-O-(4-fluorobenzenesulfonyl)-α-dimethylglyoxime, bis-O-(4-trifluoromethylbenzenesulfonyl)-α-dimethylglyoxime, bis-O-(xylenesulfonyl)-α-dimethylglyoxime, bis-O-(trifluoromethanesulfonyl)nioxime, bis-O-(2,2,2-trifluoroethanesulfonyl)nioxime, bis-O-(10-camphorsulfonyl)nioxime, bis-O-(benzenesulfonyl)nioxime, bis-O-(4-fluorobenzenesulfonyl)nioxime, bis-O-(4-trifluoromethylbenzenesulfonyl)nioxime, and bis-O-(xylenesulfonyl)nioxime.

PAGs in the form of oxime sulfonates with a long conjugated system separated by thiophene or cyclohexadiene include (5-(p-toluenesulfonyl)oxyimino-5H-thiophen-2-ylidene)phenylacetonitrile, (5-(10-camphorsulfonyl)ox) imino-5H-thiopben-2-ylidene)phenylacetonitrile, (5-n-octanesulfonyloxyimino-5H-thiopben-2-ylidene) phenylacetonitrile, (5-(p-toluenesulfonyl)oxyimino-5H-thiophen-2-ylidene)(2-methylphenyl)acetonitrile (5-(10-camphorsulfonyl)oxyimino-5H-thiopben-2-ylidene)(2-methylphenyl)acetonitrile (5-n-octanesulfonyloxyimino-5H-thiophen-2-ylidene)(2-methylphenyl)acetonitrile, (5-(4-(p-toluenesulfonyloxy)benenesulfonyl)oxyimino-5H-thiophen-2-ylidene)-phenylacetonitrile, and (5-(2,5-bis(p-toluenesulfonyloxy)benzenesulfonyl)oxyimino-5H-thiophen-2-ylidene)-phenylacetonitrile.

Suitable oxime sulfonates having an electron withdrawing group such as trifluoromethyl incorporated for increased stability include 2,2,2-trifluoro-1-phenylethanone O-(methylsulfonyl)oxime, 2,2,2-trifluoro-1-phenylethanone O-(10-camphorsulfonyl)oxime, 2,2,2-trifluoro-1-phenylethanone O-(4-methoxybenzenesulfonyl)oxime 2,2,2-trifluoro-1-phenylethanone O-(1-naphthylsulfonyl)oxime, 2,2,2-trifluoro-1-phenylethanone O-(2-naphthylsulfonyl)oxime, 2,2,2-trifluoro-1-phenylethanone O-(2,4,6-trimethylphenylsulfonyl) oxime 2,2,2-trifluoro-1-(4-methylphenyl)ethanone O-(10-camphorsulfonyl)oxime, 2,2,2-trifluoro-1-(4-methylphenyl) ethanone O-(methylsulfonyl)oxime, 2,2,2-trifluoro-1-(2-methylphenyl)ethanone O-(10-camphorsulfonyl)oxime, 2,2,2-trifluoro-1-(2,4-dimethylphenyl)ethanone O-(10-camphorsulfonyl)oxime, 2,2,2-trifluoro-1-(2,4- dimethylphenyl)ethanone O-(1-naphthylsulfonyl)oxime, 2,2,2-trifluoro-1-(2,4-dimethylphenyl)ethanone O-(2-naphthylsulfonyl)oxime, 2,2,2-trifluoro-1-(2,4,6-trimethylphenyl)ethanone O-(10-camphorsulfonyl)oxime, 2,2,2-trifluoro-1-(2,4,6-trimethylphenyl)ethanone O-(1-naphthylsulfonyl)oxime, 2,2,2-trifluoro-1-(2,4,6-trimethylphenyl)ethanone O-(2-naphthylsulfonyl)oxime, 2,2,2-trifluoro-1-(4-methoxyphenyl)ethanone O-(methylsulfonyl)oxime, 2,2,2-trifluoro-1-(4-methylthiophenyl)ethanone O-(methylsulfonyl)oxime, 2,2,2-trifluoro-1-(3,4-dimethoxyphenyl)ethanone O-(methylsulfonyl)oxime, 2,2,2-trifluoro-1-(4-methoxyphenyl)ethanone O-(4-methylphenylsulfonyl)oxime, 2,2,2-trifluoro-1-(4-methoxyphenyl)ethanone O-(4-methoxyphenylsulfonyl)oxime, 2,2,2-trifluoro-1-(4-methoxyphenyl)ethanone O-(4-dodecylphenylsulfonyl)oxime, 2,2,2-trifluoro-1-(4-methoxyphenyl)ethanone O-(octylsulfonyl)oxime, 2,2,2-trifluoro-1-(4-thiomethylphenyl)ethanone O-(4-methoxyphenylsulfonyl)oxime, 2,2,2-trifluoro-1-(4-thiomethylphenyl)ethanone O-(4-dodecylphenylsulfonyl)oxime, 2,2,2-trifluoro-1-(4-thiomethylphenyl)ethanone O-(octylsulfonyl)oxime, 2,2,2-trifluoro-1-(4-thiomethylphenyl)ethanone O-(2-naphthylsulfonyl)oxime, 2,2,2-trifluoro-1-(2-methylphenyl)ethanone O-(methylsulfonyl)oxime, 2,2,2-trifluoro-1-(4-methylphenyl)ethanone O-(phenylsulfonyl)oxime, 2,2,2-trifluoro-1-(4-chlorophenyl)ethanone O-(phenylsulfonyl)oxime, 2,2,3,3,4,4,4-heptafluoro-1-phenylbutanone O-(10-camphorsulfonyl)oxime, 2,2,2-trifluoro-1-(1-naphthyl)ethanone O-(methylsulfonyl)oxime, 2,2,2-trifluoro-1-(2-naphthyl)ethanone O-(methylsulfonyl)oxime, 2,2,2-trifluoro-1-(4-benzylphenyl)ethanone O-(methylsulfonyl)oxime, 2,2,2-trifluoro-1-(4-(phenyl-1,4-dioxa-but-1-yl)phenyl)ethanone O-(methylsulfonyl)oxime, 2,2,2-trifluoro-1-(1-naphthyl)ethanone O-(propylsulfonyl)oxime, 2,2,2-trifluoro-1-(2-naphthyl)ethanone O-(propylsulfonyl)oxime, 2,2,2-trifluoro-1-(4-benzylphenyl)ethanone O-(propylsulfonyl)oxime, 2,2,2-trifluoro-1-(4-methylsulfonylphenyl)ethanone O-(propylsulfonyl)oxime, 2,2,2-trifluoro-1-(4-methylsulfonyloxyphenyl)ethanone O-(propylsulfonyl)oxime, 2,2,2-trifluoro-1-(4-methylcarbonyloxyphenyl)ethanone O-(propylsulfonyl)oxime, 2,2,2-trifluoro-1-(6H,7H-5,8-dioxonaphth-2-yl)ethanone O-(propylsulfonyl)oxime, 2,2,2-trifluoro-1-(4-methoxycarbonylmethoxyphenyl)ethanone O-(propylsulfonyl)oxime, 2,2,2-trifluoro-1-(4-methoxycarbonyl)-(4-amino-1-oxa-pent-1-yl)phenyl)ethanone O-(propylsulfonyl)oxime, 2,2,2-trifluoro-1-(3,5-dimethyl-4-ethoxyphenyl)ethanone O-(propylsulfonyl)oxime, 2,2,2-trifluoro-1-(4-benzyloxyphenyl)ethanone O-(propylsulfonyl)oxime, 2,2,2-trifluoro-1-(2-thiophenyl)ethanone O-(propylsulfonate)oxime, and 2,2,2-trifluoro-1-(1-dioxathiophen-2-yl)ethanone O-(propylsulfonate)oxime; 2,2,2-trifluoro-1-(4-(3-(4-(2,2,2-trifluoro-1-(trifluoromethanesulfonyloxyimino)ethyl)-phenoxy)propoxy)phenyl)ethanone O-(trifluoromethanesulfonyl)oxime, 2,2,2-trifluoro-1-(4-(3-(4-(2,2,2-trifluoro-1-(1-propanesulfonyloxyimino)ethyl)phenoxy)-propoxy)phenyl)ethanone O-(propylsulfonyl)oxime, 2,2,2-trifluoro-1-(4-(3-(4-(2,2,2-trifluoro-1-(1-butanesulfonyloxyimino)ethyl)phenoxy)-propoxy)phenyl)ethanone O-(butylsulfonyl)oxime, 2,2,2-trifluoro-1-(4-(3-(4-(2,2,2-trifluoro-1-(4-(4-methylphenylsulfonyloxy)phenyl-sulfonyloxyimino)ethyl) phenoxy)propoxy)phenyl)ethanone O-(4-(4-methylphenylsulfonyloxy)phenylsulfonyl)oxime, and 2,2,2-trifluoro-1-(4-(3-(4-(2,2,2-trifluoro-1-((2,5-bis(4-methylphenylsulfonyloxy)-benzenesulfonyloxy) phenylsulfonyloxyimino)ethyl)phenoxy)propoxy)phenyl) ethanone O-((2,5-bis(4-methylphenylsulfonyloxy)benzenesulfonyloxy)phenylsulfonyl)oxime.

Suitable oxime sulfonate PAGs using substituted acetonitrile derivatives include α-(p-toluenesulfonyloxyimino)-phenylacetonitrile, α-(p-chlorobenzenesulfonyloxyimino)-phenylacetonitrile, α-(4-nitrobenzenesulfonyloxyimino)-phenylacetonitrile, α-(4-nitro-2-trifluoromethylbenzenesulfonyloxyimino)-phenylacetonitrile, α-(benzenesulfonyloxyimino)-4-chlorophenylacetonitrile, α-(benzenesulfonyloxyimino)-2,4-dichlorophenylacetonitrile, α-(benzenesulfonyloxyimino)-2,6-dichlorophenylacetonitrile, α-(benzenesulfonyloxyimino)-4-methoxyphenylacetonitrile, α-(2-chlorobenzenesulfonyloxyimino)-4-methoxyphenylacetonitrile, α-(benzenesulfonyloxyimino)-2-thienylacetonitrile, α-(4-dodecylbenzenesulfonyloxyimino)-phenylacetonitrile, α-[(4-toluenesulfonyloxyimino)-4-methoxyphenyl]acetonitrile, α-[(dodecylbenzenesulfonyloxyimino)-4-methoxyphenyl]acetonitrile, α-(tosyloxyimino)-3-thienylacetonitrile, α-(methylsulfonyloxyimino)-1-cyclopentenylacetonitrile, α-(ethylsulfonyloxyimino)-1-cyclopentenylacetonitrile, α-(isopropylsulfonyloxyimino)-1-cyclopentenylacetonitrile, α-(n-butylsulfonyloxyimino)-1-cyclopentenylacetonitrile, α-(ethylsulfonyloxyimino)-1-cyclohexenylacetonitrile, α-(isopropylsulfonyloxyimino)-1-cyclohexenylacetonitrile, and α-(n-butylsulfonyloxyimino)-1-cyclohexenylacetonitrile.

Suitable bisoxime sulfonate PAGs include bis(α-(p-toluenesulfonyloxy)imino)-p-phenylenediacetonitrile, bis(α-(benzenesulfonyloxy)imino)-p-phenylenediacetonitrile, bis(α-(methanesulfonyloxy)imino)-p-phenylenediacetonitrile, bis(α-(butanesulfonyloxy)imino)-p-phenylenediacetonitrile, bis(α-(10-camphorsulfonyloxy)imino)-p-phenylenediacetonitrile, bis(α-(trifluoromethanesulfonyloxy)imino)-p-phenylenediacetonitrile bis(α-(4-methoxybenzenesulfonyloxy)imino)-p-phenylenediacetonitrile, bis(α-(p-toluenesulfonyloxy)imino)-m-phenylenediacetonitrile, bis(α-(benzenesulfonyloxy)imino)-m-phenylenediacetonitrile, bis(α-(methanesulfonyloxy)imino)-m-phenylenediacetonitrile, bis(α-(butanesulfonyloxy)imino)-m-phenylenediacetonitrile, bis(α-(10-camphorsulfonyloxy)imino)-m-phenylenediacetonitrile bis(α-(trifluoromethanesulfonyloxy)imino)-m-phenylenediacetonitrile, and bis(α-(4-methoxybenzenesulfonyloxy)imino)-m-phenylenediacetonitrile.

Also oxime sulfonates having the formula (Ox-1) are useful as the PAG.

(Ox-1)

Herein $R^{101}$ is a substituted or unsubstituted $C_1$-$C_{10}$ haloalkylsulfonyl or halobenzenesulfonyl group, $R^{102}$ is a $C_1$-$C_{11}$ haloalkyl group, and $R^{103}$ is a substituted or unsubstituted aryl or hetero-aryl group.

Examples of the oxime sulfonate having formula (Ox-1) include 2-[2,2,3,3,4,4,5,5-octafluoro-1-(nonafluorobutylsulfonyloxyimino)pentyl]fluorene, 2-[2,2,3,3,4,4-pentafluoro-1-(nonafluorobutylsulfonyloxyimino)butyl]fluorene, 2-[2,2,3,3,4,4,5,5,6,6-decafluoro-1-

(nonafluorobutylsulfonyloxyimino)hexyl]fluorene, 2-[2,2,3, 3,4,4,5,5-octafluoro-1-(nonafluorobutylsulfonyloxyimino) pentyl]-4-biphenyl, 2-[2,2,3,3,4,4-pentafluoro-1-(nonafluorobutylsulfonyloxyimino)butyl]-4-biphenyl, and 2-[2,2,3,3,4,4,5,5,6,6-decafluoro-1-(nonafluorobutylsulfonyloxyimino)hexyl]-4-biphenyl.

Among these, the preferred PAGs are sulfonium salts, bissulfonyldiazomethane, N-sulfonyloxyimide, and sulfonyloxime compounds.

Although the optimum anion of the generated acid varies with such factors as ease of scission of the acid labile group in the polymer, an anion which is non-volatile and not extremely highly diffusive is generally selected. Appropriate anions include anions of benzenesulfonic acid, toluenesulfonic acid, 4-(4-toluenesulfonyloxy)benzenesulfonic acid, pentafluorobenzenesulfonic acid, 2,2,2-trifluoroethanesulfonic acid, nonafluorobutanesulfonic acid, heptadecafluorooctanesulfonic acid, and camphorsulfonic acid.

The PAG (B) is added in an amount of 0.2 to 20 parts, preferably 0.3 to 10 parts by weight per 100 parts by weight of the polymer as component (A). Practically acceptable sensitivity and pattern profile are available as long as the PAG amount is in the range. The PAG may be used alone or in admixture of two or more. The transmittance of the resist film can be controlled by using a PAG having a low transmittance at the exposure wavelength and adjusting the amount of the PAG added.

(C) Organic Solvent

The organic solvent as component (C) is not particularly limited as long as it has a sufficient solubility relative to other components and a film-forming ability. Suitable organic solvents include cellosolve solvents such as methyl cellosolve, ethyl cellosolve, methyl cellosolve acetate, and ethyl cellosolve acetate: propylene glycol solvents such as propylene glycol and dipropylene glycol; propylene glycol alkyl ether solvents such as propylene glycol monomethyl ether and propylene glycol monobutyl ether, propylene glycol alkyl ether acetate solvents such as propylene glycol monomethyl ether acetate, propylene glycol dimethyl ether, and propylene glycol monoethyl ether acetate; ester solvents such as butyl acetate, pentyl acetate, methyl lactate, ethyl lactate, ethyl 3-methoxypropionate, and ethyl 3-ethoxypropionate; alcohol solvents such as methanol, ethanol, isopropanol, butanol, hexanol and diacetone alcohol, ketone solvents such as acetone, cyclohexanone, cyclopentanone, methyl ethyl ketone, methyl pentyl ketone and methyl isobutyl ketone; ether solvents such as methyl phenyl ether and diethylene glycol dimethyl ether, highly polar solvents such as N,N-dimethylformamide, N-methylpyrrolidone, and dimethyl sulfoxide; and mixtures thereof.

Of these solvents, propylene glycol alkyl ether acetates, alkyl lactates, and alkyl ketones are preferred. The solvents may be used alone or in admixture. It is noted that the alkyl group of the propylene glycol alkyl ether acetate is preferably of 1 to 4 carbon atoms, for example, methyl, ethyl and propyl, with methyl and ethyl being especially preferred. Since the propylene glycol alkyl ether acetates include 1,2- and 1,3-substituted ones, each includes three isomers depending on the combination of substituted positions, which may be used alone or in admixture. Also, the alkyl group of the alkyl lactate is preferably of 1 to 4 carbon atoms, for example, methyl, ethyl and propyl, with methyl and ethyl being especially preferred. The alkyl group of the alkyl ketone is preferably of 1 to 10 carbon atoms, for example, methyl, ethyl, propyl, isobutyl, cyclopentyl and cyclohexyl, with isobutyl, cyclopentyl and cyclohexyl being especially preferred.

The content of the organic solvent (C) is 3 to 30% by weight, preferably 5 to 25% by weight of the resist film. If the organic solvent content exceeds 30% by weight, it is difficult to form a film. If the organic solvent content is less than 3% by weight, a film with such a low organic solvent content is liable to crack. The organic solvent may be used alone or in admixture. The resist film is characterized in that the film retains the organic solvent (C) therein for at least 2 hours, preferably at least 1 week at normal temperature.

(D) Ester Bond-Bearing Polymer

Component (D) is a polymer having an ester bond in its backbone. Preferably, it is the condensation product (known as polyester) of a polyfunctional carboxylic acid with a polyhydric alcohol. It may also be the condensation product of a polyfunctional carboxylic anhydride with a polyhydric alcohol.

Preferred polyfunctional carboxylic acids are those having 2 to 6 carboxyl groups, for example, oxalic acid, succinic acid, malonic acid, glutaric acid, adipic acid, pimelic acid, suberic acid, azelaic acid, sebacic acid, brassilic acid, methylmalonic acid, citraconic acid, fumaric acid, maleic acid, methylmaleic acid, mesaconic acid, glutaric acid, itaconic acid, allylmalonic acid, teraconic acid, muconic acid, butynedioic acid, aconitic acid, malic acid, tartaric acid, citric acid, oxomalonic acid, oxosuccinie acid, thiomalic acid, glutamic acid, ethylene diamine tetraacetic acid, 1,2-cyclopropane dicarboxylic acid, truxillie acid, camphoric acid, phthalic acid, isophthalic acid, terephthalic acid, phenylsuccinic acid, 2-(3-carboxyphenyl)-2-oxoacetic acid, meconic acid, and cyclobutane dicarboxylic acid. Anhydrides of the foregoing acids are also useful. Of these, difunctional carboxylic acids are preferred. The polyfunctional carboxylic acid may be used alone or in admixture.

Suitable polyhydric alcohols include 1,2-propanediol, 1,3-propanediol, 1,2-butanediol, 1,3-butanediol, 3-methyl-1,3-butanediol, 1,4-butanediol, 1,4-cyclohexanemethanediol, 1,2-pentanediol, 1,3-pentanediol, 1,5-pentanediol, 1,6-hexanediol, 2-methyl-2,4-pentanediol, 3-methyl-1,5-pentanediol, ethylene glycol, propylene glycol, neopentyl glycol, glycerol, and pentaglycerol. Of these, dihydric alcohols are preferred. The polyhydric alcohol may be used alone or in admixture.

Condensation polymerization of these reactants may be carried out by a well-known method. The amounts of reactants may be adjusted in accordance with the desired molecular weight of the resulting polymer. Typically, about 0.5 to 3 moles of the polyhydric alcohol is used per mole of the polyfunctional carboxylic acid.

Esterification may accord with a well-known method. Typically condensation reaction may be performed by using an acidic catalyst such as sulfuric acid and a metal compound such as a titanium, tin, zinc, germanium or antimony compound, and optionally heating at a temperature of about 150 to 300° C.

Since component (D) is one component of the positive resist film, it is preferably alkali soluble, especially soluble in an aqueous solution of tetramethylammonium hydroxide (TMAH).

The polymer as component (D) preferably has a Mw of 700 to 50,000, more preferably 1,500 to 45,000. This range of Mw avoids any thickness loss of resist film in the unexposed region during development and provides a proper development rate.

An amount of component (D) is preferably 5 to 100 parts by weight, more preferably 10 to 60 parts by weight, even more preferably 15 to 50 parts by weight per 100 parts by weight of the polymer as component (A). As long as the amount of component (D) is within the range, the risk of voids during transfer of the resist film to a substrate and the risk of thickness loss of resist film in the unexposed region during development are avoided. The polymer as component (D) may be used alone or in admixture.

(E) Benzotriazole Compound

The resist film may further contain (E) a benzotriazole compound for the purpose of improving the pattern profile on a metal substrate such as Cu.

The benzotriazole compound (E) is typically a compound having the formula (E-1).

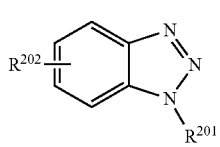

Herein $R^{201}$ is hydrogen, hydroxyl amino, a substituted or unsubstituted $C_1$-$C_6$ alkyl, substituted or unsubstituted phenyl, sulfonyl-containing substituent group, or —Z—Y, wherein Z is carbonyl or a $C_1$-$C_{12}$ alkylene, cycloalkylene or alkylene ether group, Y is hydrogen, halogen, cyano, hydroxyl, $C_1$-$C_6$ alkoxy, carboxyl, or dialkylamino group in which each alkyl moiety is of $C_1$-$C_6$. $R^{202}$ is hydrogen, halogen, hydroxyl, substituted or unsubstituted $C_1$-$C_6$ alkyl, $C_1$-$C_6$ alkoxy, sulfonyl-containing substituent group, or an organic group of the formula (E-1-1):

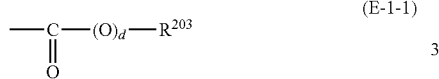

wherein $R^{203}$ is hydrogen or substituted or unsubstituted $C_1$-$C_{12}$ alkyl, and d is 0 or 1.

A compound having the formula (E-2) is also the preferred benzotriazole compound (E).

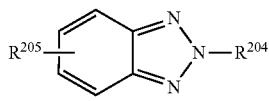

Herein $R^{204}$ is hydrogen, hydroxyl amino, a substituted or unsubstituted $C_1$-$C_6$ alkyl, substituted or unsubstituted phenyl, sulfonyl-containing substituent group, or —Z—Y, wherein Z is carbonyl or a $C_1$-$C_{12}$ alkylene, cycloalkylene or alkylene ether group, Y is hydrogen, halogen, cyano, hydroxyl, $C_1$-$C_6$ alkoxy, carboxyl, or dialkylamino group in which each alkyl moiety is of $C_1$-$C_6$. $R^{205}$ is hydrogen, halogen, hydroxyl, substituted or unsubstituted $C_1$-$C_6$ alkyl, $C_1$-$C_6$ alkoxy, sulfonyl-containing substituent group, or an organic group of the formula (E-1-1).

Examples of the benzotriazole compound (E) include benzotriazole, 1-hydroxybenzotriazole, 1-methylbenzotriazole, 1-hydroxymethylbenzotriazole, 1-ethylbenzotriazole, 1-(1-hydroxyethyl)benzotriazole, 1-(2-hydroxyethyl)benzotriazole, 1-propylbenzotriazole, 1-(1-hydroxypropyl)benzotriazole, 1-(2-hydroxypropyl)benzotriazole, 1-(3-hydroxypropyl)benzotriazole, 4-hydroxy-1H-benzotriazole, 5-methyl-1H-benzotriazole, benzotriazole-5-carboxylic acid, 1-methylbenzotriazole-5-carboxylic acid, 1-ethylbenzotriazole-5-carboxylic acid, 1-t-butylbenzotriazole-5-carboxylic acid, 1-(2-cyclopentylethyl)benzotriazole-5-carboxylic acid, 1H-benzotriazole-4-sulfonic acid, 1H-benzotriazole-1-acetonitrile, 1H-benzotriazole-1-carboxyaldehyde, 2-methyl-2H-benzotriazole, and 2-ethyl-2H-benzotriazole.

The benzotriazole compound (E) is added in an amount of 0 to 10 parts, preferably 0.03 to 5 parts by weight per 100 parts by weight of the polymer as component (A). More than 10 pbw of component (E) may achieve little extra effect despite an increased amount or adversely affect sensitivity and film retention. The benzotriazole compound may be used alone or in admixture.

(F) Imidazole Compound

The resist film may further contain (F) an imidazole compound for the purpose of improving the pattern profile on a metal substrate such as Cu. The imidazole compound (F) is typically selected from compounds having the formulae (F-1) to (F-6).

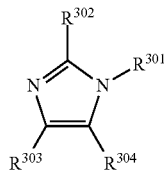

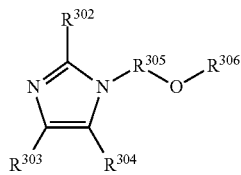

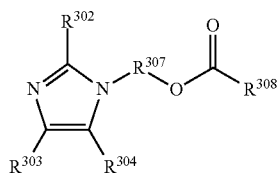

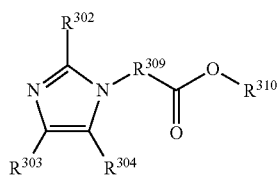

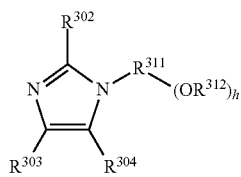

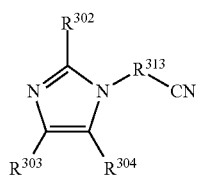

Herein $R^{301}$ is a $C_2$-$C_{20}$ straight, branched or cyclic alkyl group having at least one polar functional moiety which is selected from among hydroxyl, carbonyl, ester, ether, sulfide, carbonate, cyano and acetal. $R^{302}$, $R^{303}$ and $R^{304}$ are each independently hydrogen, a $C_1$-$C_{10}$ straight, branched or cyclic alkyl, $C_6$-$C_{10}$ aryl or $C_7$-$C_{10}$ aralkyl group. $R^{305}$, $R^{307}$, $R^{309}$ and $R^{313}$ are each independently a $C_1$-$C_{10}$ straight, branched or cyclic alkylene group. $R^{306}$ and $R^{308}$ are each independently hydrogen or a $C_1$-$C_{15}$ alkyl group which may contain at least one moiety selected from among hydroxyl, carbonyl, ester, ether, sulfide, carbonate, cyano and acetal. $R^{310}$ is a $C_1$-$C_{15}$ alkyl group which may contain at least one moiety selected from among hydroxyl, carbonyl, ester, ether, sulfide, carbonate, cyano and acetal. $R^{311}$ is a (h+1)-valent, $C_2$-$C_{10}$ straight, branched or cyclic hydrocarbon group. $R^{312}$ is each independently hydrogen or a $C_1$-$C_{15}$ alkyl group which may contain at least one moiety selected from among hydroxyl, carbonyl, ester, ether, sulfide, carbonate, cyano and acetal, or two $R^{312}$ groups may bond together to form a ring, and h is 2, 3, 4 or 5.

Preferred examples of the imidazole compound include imidazole, 2-methylimidazole, 1,2-dimethylimidazole, 2-ethyl-4-methylimidazole, 2-phenylimidazole, and 2-phenyl-4-methylimidazole.

The imidazole compound (F) is added in an amount of 0 to 10 parts, preferably 0.03 to 5 parts by weight per 100 parts by weight of the polymer as component (A). More than 10 pbw of component (F) may adversely affect sensitivity. The imidazole compound may be used alone or in admixture.

(G) Basic Compound

In one preferred embodiment, the resist film may further contain (G) a basic compound. The basic compound (G) is preferably a compound capable of suppressing the rate of diffusion when the acid generated by the PAG diffuses within the resist film. The inclusion of this type of basic compound holds down the rate of acid diffusion within the resist film, resulting in better resolution. In addition, it suppresses changes in sensitivity following exposure and reduces substrate and environment dependence, as well as improving the exposure latitude and the pattern profile.

Examples of the basic compound (G) include primary, secondary, and tertiary aliphatic amines, mixed amines, aromatic amines, heterocyclic amines, nitrogen-containing compounds having carboxyl group, nitrogen-containing compounds having sulfonyl group, nitrogen-containing compounds having hydroxyl group, nitrogen-containing compounds having hydroxyphenyl group, alcoholic nitrogen-containing compounds, amide derivatives, and imide derivatives.

Examples of suitable primary aliphatic amines include ammonia, methylamine, ethylamine, n-propylamine, isopropylamine, n-butylamine, isobutylamine, sec-butylamine, t-butylamine, pentylamine, t-pentylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine. Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-t-butylpyridine, diphenylpyridine, benzylpyridine, methoxypyridine, butoxypyridine, dimethoxypyridine, 1-methyl-2-pyridine, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable nitrogen-containing compounds having carboxyl group include aminobenzoic acid, indolecarboxylic acid, and amino acid derivatives (e.g. nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable nitrogen-containing compounds having sulfonyl group include 3-pyridinesulfonic acid and pyridinium p-toluenesulfonate. Examples of suitable nitrogen-containing compounds having hydroxyl group, nitrogen-containing compounds having hydroxyphenyl group, and alcoholic nitrogen-containing compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

Further, basic compounds of the following formula (G-1) may be included alone or in admixture.

(G-1)

In the formula, e is equal to 1, 2 or 3; $X^1$ is independently hydrogen or a $C_1$-$C_{20}$ straight, branched or cyclic alkyl group which may contain a hydroxyl or ether moiety; and $X^2$ is independently selected from groups of the following formulae (G-2) to (G-4), and two or three $X^2$ may bond together to form a ring with the nitrogen atom to which they are attached.

(G-2)

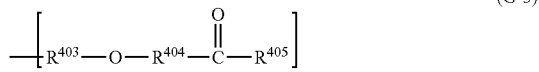

(G-3)

(G-4)

In the formulae, $R^{401}$, $R^{403}$ and $R^{406}$ are independently a $C_1$-$C_4$ straight or branched alkylene group. $R^{402}$ and $R^{405}$ are independently hydrogen, or a $C_1$-$C_{20}$ straight, branched or cyclic alkyl group which may contain at least one hydroxyl, ether or ester moiety or lactone ring. $R^{404}$ is a single bond or a $C_1$-$C_4$ straight or branched alkylene group. $R^{407}$ is a $C_1$-$C_{20}$ straight, branched or cyclic alkyl group which may contain at least one hydroxyl, ether or ester moiety or lactone ring.

Illustrative examples of the basic compound having formula (G-1) include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{2-(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4, 1-aza-15-crown-5, 1-aza-18-crown-6, tris(2-formyloxyethyl)amine, tris(2-acetoxyethyl)amine, tris(2-propionyloxyethyl)amine, tris(2-butyryloxyethyl)amine, tris(2-isobutyryloxyethyl)amine, tris(2-valeryloxyethyl)amine, tris(2-pivaloyloxyethyl)thiyl)amine, N,N-bis(2-acetoxyethyl)-2-(acetoxyacetoxy)ethylamine, tris(2-methoxycabonyloxyethyl)amine, tris(2-t-butoxycarbonyloxyethyl)amine, tris[2-(2-oxopropoxy)ethyl]amine, tris[2-(methoxycarbonylmethyloxy)ethyl]amine, tris[2-(t-butoxycarbonylmethyloxy)ethyl]amine tris[2-(cyclohexyloxycarbonylmethyloxy)ethyl]amine, tris(2-methoxycarbonylethyl)amine, tris(2-ethoxycarbonylethyl)amine, N,N-bis(2-hydroxyethyl)-2-(methoxycarbonyl)ethylamine, N,N-bis(2-acetoxyethyl)-2-(methoxycarbonyl)ethylamine, N,N-bis(2-hydroxyethyl)-2-(ethoxycarbonyl)ethylamine, N,N-bis(2-acetoxyethyl)-2-(ethoxycarbonyl)ethylamine, N,N-bis(2-hydroxyethyl)-2-(2-methoxyethoxycarbonyl)ethylamine, N,N-bis(2-acetoxyethyl)-2-(2-methoxyethoxycarbonyl)ethylamine, N,N-bis(2-hydroxyethyl)-2-(2-hydroxyethoxycarbonyl)ethylamine, N,N-bis(2-acetoxyethyl)-2-(2-acetoxyethoxycarbonyl)ethylamine, N,N-bis(2-hydroxyethyl)-2-[(methoxycarbonyl)methoxycarbonyl]ethylamine, N,N-bis(2-acetoxyethyl)-2-[(methoxycarbonyl)methoxycarbonyl]ethylamine N,N-bis(2-hydroxyethyl)-2-(2-oxopropoxycarbonyl)ethylamine, N,N-bis(2-acetoxyethyl)-2-(2-oxopropoxycarbonyl)ethylamine, N,N-bis(2-hydroxyethyl)-2-(tetrahydrofurfuryloxycarbonyl)ethylamine, N,N-bis(2-acetoxyethyl)-2-(tetrahydrofurfuryloxycarbonyl)ethylamine, N,N-bis(2-hydroxyethyl)-2-[(2-oxotetrahydrofuran-3-yl)oxycarbonyl]ethylamine, N,N-bis(2-acetoxyethyl)-2-[(2-oxotetrahydrofuran-3-yl)oxycarbonyl]ethylamine, N,N-bis(2-hydroxyethyl)-2-(4-hydroxybutoxycarbonyl)ethylamine, N,N-bis(2-formyloxyethyl)-2-(4-formyloxybutoxycarbonyl)ethylamine, N,N-bis(2-formyloxyethyl)-2-(2-formyloxyethoxycarbonyl)ethylamine, N,N-bis(2-methoxyethyl)-2-(methoxycarbonyl)ethylamine, N-(2-hydroxyethyl)-bis[2-(methoxycarbonyl)ethyl]amine, N-(2-acetoxyethyl)-bis[2-(methoxycarbonyl)ethyl]amine, N-(2-hydroxyethyl)-bis[2-(ethoxycarbonyl)ethyl]amine, N-(2-acetoxyethyl)-bis[2-(ethoxycarbonyl)ethyl]amine, N-(3-hydroxy-1-propyl)-bis[2-(methoxycarbonyl)ethyl]amine, N-(3-acetoxy-1-propyl)-bis[2-(methoxycarbonyl)ethyl]amine, N-(2-methoxyethyl)-bis[2-(methoxycarbonyl)ethyl]amine, N-butyl-bis[2-(methoxycabonyl)ethyl]amine, N-butyl-bis[2-(2-methoxyethoxycarbonyl)ethyl]amine, N-methyl-bis(2-acetoxyethyl)amine, N-ethyl-bis(2-acetoxyethyl)amine, N-methyl-bis(2-pivaloyloxyethyl)amine, N-ethyl-bis[2-(methoxycarbonyloxy)ethyl]amine, N-ethyl-bis[2-(tert-butoxycarbonyloxy)ethyl]amine, tris(methoxycarbonylmethyl)amine, tris(ethoxycarbonylmethyl)amine, N-butyl-bis(methoxycarbonylmethyl)amine, N-hexyl-bis(methoxycarbonylmethyl)amine, and β-(diethylamino)-δ-valerolactone.

The basic compound (G) is preferably formulated in an amount of 0 to 5 parts, and especially 0.01 to 2 parts by weight per 100 parts by weight of the polymer as component (A). More than 5 parts of the basic compound may result in too low a sensitivity. The basic compounds may be used alone or in admixture.

(H) Polyvinyl Ether Resin

The resist film may further contain (H) a polyvinyl ether resin comprising recurring units having the formula (H).

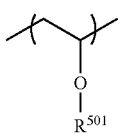

(H)

Herein $R^{501}$ is a $C_1$-$C_{10}$ monovalent hydrocarbon group, preferably a $C_1$-$C_{10}$ alkyl group such as methyl, ethyl, propyl or butyl.

The polyvinyl ether resin preferably has a Mw of 1.000 to 500,000, more preferably 2,000 to 50,000. This range of Mw ensures satisfactory solubility in the organic solvent and eliminates the risk of cracking after the plating step to be described later.

The polyvinyl ether resin (H) is preferably formulated in an amount of 0 to 100 parts, and especially 10 to 50 parts by weight per 100 parts by weight of the polymer as component (A). The polyvinyl ether resin may be used alone or in admixture.

(I) Dissolution Accelerator

The resist film may further contain (I) a dissolution accelerator. The dissolution accelerator (1) is not particularly limited as long as it is a compound which is soluble in alkaline aqueous solutions. Typical are compounds containing a hydroxyl and/or carboxyl group and having a Mw of 500 to 100,000. Suitable compounds include low-nucleus phenolic compounds, phenolic resins, polyhydroxystyrene, copolymers of hydroxystyrene with a carboxyl-containing vinyl monomer, polymers obtained from copolymerization of carboxyl-containing monomers such as acrylic acid, methacrylic acid, (meth)acrylate or maleic acid, polymers obtained from copolymerization of hydroxystyrene with a carboxyl-containing monomer such as acrylic acid, methacrylic acid, (meth)acrylate or maleic acid, and celluloses which are soluble in alkaline aqueous solutions. Inter alia, low-nucleus phenolic compounds, phenolic resins, polyhydroxystyrene, copolymers of acrylic monomers, and alkaline solution-soluble celluloses are preferred.

The dissolution accelerator (I) may be used when it is desired to shorten the development time because it is dissolvable in alkaline aqueous solution independent of irradiation of radiation and/or actinic light.

The dissolution accelerator (I) is preferably formulated in an amount of 0 to 50 parts, and especially 5 to 25 parts by weight per 100 parts by weight of the polymer as component (A). More than 50 parts of the dissolution accelerator may give rise to a film thickness loss that even the film in the unexposed region is dissolved upon development. The dissolution accelerator may be used alone or in admixture.

(J) Carboxylic Acid

The resist film may further contain (J) a carboxylic acid, which is typically selected from saturated or unsaturated aliphatic carboxylic acids, alicyclic carboxylic acids, oxy carboxylic acids, alkoxy carboxylic acids, keto carboxylic acids, and aromatic carboxylic acids.

Suitable saturated aliphatic carboxylic acids are mono- or polyfunctional carboxylic acids including formic acid, acetic acid, propionic acid, butyric acid, isobutyric acid, valeric acid, caproic acid, enanthic acid, oxalic acid, malonic acid, succinic acid, glutaric acid, adipic acid, pimelic acid, and suberic acid. Suitable unsaturated aliphatic carboxylic acids include acrylic acid, crotonic acid, isocrotonic acid, 3-butenoic acid, methacrylic acid, 4-pentenoic acid, propionic acid, 2-butynoic acid, maleic acid, and fumaric acid. Typical of the oxy carboxylic acid is oxyacetic acid. Typical of the alkoxy carboxylic acid is to methoxyacetic acid. Typical of the keto carboxylic acid is pyruvic acid. Suitable aromatic carboxylic acids include benzoic acid, p-hydroxybenzoic acid, o-hydroxybenzoic acid, phthalic acid, terephthalic acid and isophthalic acid. Of these, dicarboxylic acids are preferred, with saturated aliphatic dicarboxylic acids being most preferred.

An appropriate amount of carboxylic acid used is 0 to 1 part, more preferably 0.0001 to 0.5 part by weight per 100 parts by weight of the polymer as component (A). More than 1 part by weight of the carboxylic acid may adversely affect adhesion. The carboxylic acid may be used alone or in admixture.

(K) Surfactant

The resist film may further contain (K) a surfactant. Illustrative, non-limiting, examples of the surfactant include nonionic surfactants, for example, polyoxyethylene alkyl ethers such as polyoxyethylene lauryl ether, polyoxyethylene stearyl ether, polyoxyethylene cetyl ether, and polyoxyethylene oleyl ether, polyoxyethylene alkylaryl ethers such as polyoxyethylene octylphenol ether and polyoxyethylene nonylphenol ether, polyoxyethylene polyoxypropylene block copolymers, sorbitan fatty acid esters such as sorbitan monolaurate, sorbitan monopalmitate, and sorbitan monostearate, polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate, and polyether silicone; fluorochemical surfactants such as EFTOP EF301, EF303 and EF352 (Tohkem Products Co., Ltd.), Megaface F171, F172 and F173 (DIC Corp.), Fluorad FC-4430, FC-430 and FC-431 (Sumitomo 3M Co., Ltd.), Surfynol E1004 (Nissin Chemical Industry Co., Ltd.), Asahiguard AG710, Surflon S-381, S-382, SC01, SC102, SC103, SC104, SC105, SC106, KH-10, KH-20, KH-30 and KH-40 (AGC Seimi Chemical Co., Ltd.); organosiloxane polymers KP341, X-70-092 and X-70-093 (Shin-Etsu Chemical Co., Ltd.), acrylic acid or methacrylic acid Polyflow No. 75 and No. 95 (Kyoeisha Ushi Kagaku Kogyo Co., Ltd.). Inter alia, FC-4430, KP-341 and X-70-093 are preferred. These surfactants may be used alone or in admixture.

The surfactant is preferably formulated in an amount of 0 to 5 parts, and more preferably 0.01 to 2 parts by weight per 100 parts by weight of the polymer as component (A).

Other Components

In the resist film, other optional components may be added, for example, light absorbing substances for reducing diffuse reflection from the substrate, compounds having 1,2-naphthoquinonediazidesulfonyl group in the molecule, sensitizers, crosslinkers, photobase generators, and acid amplifiers. Such optional components may be added in conventional amounts as long as they do not compromise the benefits of the invention.

Suitable light absorbing substances are dyes including azo compounds such as 2-benzeneazo-4-methylphenol and 4-hydroxy-4'-dimethylaminoazobenzene, and curcumin.

The chemically amplified positive resist film defined above is formed on the thermoplastic film such that the resist film may be transferred to another support. The resist film preferably has a thickness of 5 to 250 µm, more preferably 10 to 180 µm.

Method for Preparing Chemically Amplified Positive Resist Film Laminate

It is described how to prepare the chemically amplified positive resist film laminate. First, a uniform chemically amplified positive resist solution is prepared by dissolving the polymer (A), photoacid generator (B), the other polymer (D), and optional components (E) to (K) in the organic solvent (C) all at once or in arbitrary order. If desired, the solution may be filtered through a filter.

When the chemically amplified positive resist solution is prepared, an appropriate amount of the organic solvent (C) used is 20 to 400 parts, more preferably 30 to 200 parts by weight per 100 parts by weight of the polymer as component (A). As long as the amount of the organic solvent is in the range, a film having a uniform thickness can be formed without the risk of defects. In the practice of the invention, the desired chemically amplified positive resist film laminate is prepared by once dissolving constituent components in an excess amount of the organic solvent until uniform, followed by coating and drying steps. Thus, the amount of the organic solvent used in the step of dissolving constituent components may be adjusted as appropriate depending on the desired thickness of the final film.

In a clean room at a cleanness class of up to 1,000, the chemically amplified positive resist solution is coated on a thermoplastic film (or parting substrate), using an applicator installed in a zone which is kept at a temperature of 5 to 45° C., preferably 15 to 35° C. and a humidity of 5 to 90% e, preferably 10 to 70%. Suitable applicators include a forward roll coater, reverse roll coater, comma coater, die coater, lip coater, gravure coater, dip coater, air knife coater, capillary coater, raising and rising (R&R) coater, blade coater, bar coater, and extrusion molding machine. The resist solution is coated on a thermoplastic film while the film is preferably fed at a speed of 0.05 to 1,000 m/min, more preferably 0.1 to 500 nm/min. After coating of the resist solution, the coated film is passed through an in-line dryer or hot air circulating oven at 40 to 130° C. for 1 to 40 minutes, more preferably at 50 to 120° C. for 2 to 30 minutes, until the organic solvent and any volatiles are removed. By drying in this way, a resist film is formed on the thermoplastic film to yield the chemically amplified positive resist film laminate. A resist film may also be formed by infrared irradiation drying instead of the in-line dryer, or by plural drying means such as a combination of the in-line dryer and infrared irradiation drying, to remove the organic solvent. If necessary, a protective film (or another parting substrate) may be press bonded to the resist film laminate on a roll laminator, yielding a protected laminate.

In a clean room at a cleanness class of up to 1,000, the chemically amplified positive resist solution is coated on a thermoplastic film (or parting substrate), using an applicator installed in a zone which is kept at a temperature of 5 to 45° C., preferably 15 to 35° C. and a humidity of 5 to 90%, preferably 10 to 70%. Suitable applicators include a forward roll coater, reverse roll coater, comma coater, die coater, lip coater, gravure coater, dip coater, air knife coater, capillary coater, raising and rising (R&R) coater, blade coater, bar coater, and extrusion molding machine. The resist solution is coated on a thermoplastic film while the film is preferably fed at a speed of 0.05 to 1,000 m/min, more preferably 0.1 to 500 m/min. After coating of the resist solution, the coated film is passed through an in-line dryer or hot air circulating oven at 40 to 130° C. for 1 to 40 minutes, more preferably at 50 to 120° C. for 2 to 30 minutes, until the organic solvent and any volatiles are removed. On drying, a resist film is formed on the thermoplastic film to yield the chemically amplified positive resist film laminate. In this way, the resist film may be continuously formed as a length of resist film layer and taken up as a film roll, which is easy to handle. This is also true to the resist film laminate having the protective film formed thereon. Notably, the resist film laminate may also be formed by infrared irradiation drying instead of the in-line dryer, or by plural drying means such as a combination of the in-line dryer and infrared irradiation drying, to remove the organic solvent.

Like the thermoplastic film, the protective film used herein is not particularly limited as long as it does not adversely affect the shape or morphology of the resist film and can be separated from the positive resist film. The protective film may be a single polymer film or a multilayer film consisting of a plurality of polymer layers. Use may be made of any plastic films including nylon film, polyethylene (PE) film, polyethylene terephthalate (PET) film, polyethylene naphthalate film, polyphenylene sulfide (PPS) film, polypropylene (PP) film, polystyrene film, polymethylpentene (TPX) film, polycarbonate film, fluoro-resin film, special polyvinyl alcohol (PVA) film, and polyester film which has been treated with a parting agent.

Of these, films of PET and PE are preferred because of appropriate flexibility. Commercial available films may be used as well. Useful PET films are as mentioned above, and useful PE films include GF-8 (Tamapoly Co., Ltd.), PE FILM 0 TYPE (Nippa Corp.), Toretec 7332, Toretec 7111 and Toretec 7721 (Toray Advanced Film Co., Ltd.).

The thermoplastic film and the protective film each have a thickness of preferably 10 to 150 μm, more preferably 25 to 100 μm, from the viewpoints of stable film formation and anti-curling from the roll state wound around the windup mandrel.

On use, the protective film is peeled from the resist film in the laminate constructed as above. The peeling force of the protective film from the resist film is typically in a range of 0.1 to 500 gf/24 mm, when measured by the following method. The test is carried out according to JIS Z0237 "Test method of measuring peel adhesion of release liner from pressure-sensitive adhesive tape surface". The testing environment is under standard conditions (temperature 23±1° C., relative humidity 50±5%). The film piece used in the test has a width of 24 mm. The film width should be constant because the peel adhesion varies if the film width varies. Once a film piece of the predetermined width is furnished, measurement is carried out on a tester by peeling the protective film at an angle of 180° and a speed of 5.0±0.2 mm/sec. As to the measurement value, measurement values over the initial 25 mm portion are excluded, and an average of measurement values over the succeeding 50 mm portion is reported as the test data.

Pattern Forming Process

The resist film of the chemically amplified positive resist film laminate may be bonded to another support or substrate using a suitable laminator such as vacuum laminator or roll laminator. The substrate is selected from semiconductor substrates of Si. $SiO_2$, SiN, SiON, TiN, WSi, BPSG and SOG, metal substrates of Au, Ti, W, Cu, Ni—Fe, Ta, Zn, Co and Pb, and organic substrates such as organic antireflective coatings. The thermoplastic film is peeled off, whereby the resist film is transferred to the other support. The substrate may be of a stepped structure. In this case, the resist film having an appropriate thickness corresponding to the height of steps is used so that the resist film may be buried in steps. The resist film is advantageously applicable to a substrate having steps of the order of 0 to 200 rm. The transfer step may or may not be followed by heat treatment. When heat treatment is performed, the assembly may be prebaked on a hotplate or in an oven at 60 to 150° C. for 1 to 30 minutes, preferably at 80 to 130° C. for 1 to 10 minutes.

Next, the resist film is exposed to radiation through a mask having a desired pattern, the radiation being selected from UV, deep UV and EB, preferably radiation with a wavelength of at least 230 nm, more preferably 230 to 500 nm. The exposure dose is preferably in the range of about 10 to 5,000 mJ/cm², more preferably about 50 to 2,000 mJ/cm². If desired, the film may be baked (PEB) on a hotplate at 60 to 150° C. for 1 to 10 minutes, preferably at 80 to 120° C. for 1 to 5 minutes.

Thereafter the resist film is developed in a developer in the form of an aqueous alkaline solution, for example, 0.1 to 5 wt %, preferably 2 to 3 wt % aqueous solution of tetramethylammonium hydroxide (TMAH) for 0.1 to 60 minutes, preferably 0.5 to 10 minutes by a conventional technique such as dip, puddle or spray development. In this way, a desired resist pattern is formed on the substrate.

After the development step, electroplating or electroless plating may be carried out to form a metal plating layer on the resist pattern-bearing substrate. That is, a metal plating pattern is obtained. The plating step may be any of standard electroplating or electroless plating methods to deposit a conductor pattern, after which the resist pattern is removed.

Suitable electroplating or electroless plating methods include electrolytic Cu plating, electroless Cu plating, electrolytic Ni plating, electroless Ni plating, and electrolytic Au plating. Plating may be performed in any well-known plating baths and under standard conditions. The thickness of a plating layer is typically 80 to 100% of the thickness of the resist pattern. For example, a resist pattern of 1 μm thick is formed on a seed layer of Cu, after which a Cu plating pattern of 0.8 to 1 μm thick is deposited thereon by electrolytic Cu plating.

EXAMPLE

Examples of the invention are given below by way of illustration and not by way of limitation. All parts are by weight (pbw).

Synthesis Example 1

Synthesis of Polymer A

A flask equipped with a thermometer, nitrogen inlet tube, reflux condenser, water separator and stirrer was charged with 292 g of adipic acid, 176 g of 1,4-butanediol, and 94 g of 2-ethyl-1-hexanol as an endcapping agent. With stirring in nitrogen atmosphere, the solution was heated at 220° C., whereupon 0.024 ml of tetraisopropyl titanate was added as a catalyst. The flask was kept at a vacuum of 15-3 mmHg and 220° C. for 3 hours for condensation reaction, yielding a polymer designated Polymer A. Polymer A had a Mw of 3,500 as measured by GPC (polystyrene standards, THF solvent).

Examples 1 to 12 and Comparative Examples 1 to 5

A resist solution was prepared by dissolving components (A), (B), (D), and optionally (E) to (K) in the organic solvent (C) in accordance with the formulation shown in Table 1. The polymer as component (A) is selected from Polymers 1 to 4. The PAG as component (B) is PAG-1 which is PAI-101 by Midori Kagaku Co., Ltd. or PAG-2 which is HT-ICS by Sun-Apro Co., Ltd. The organic solvent (C) is ethyl lactate (EL), cyclopentanone (CP), or propylene glycol monomethyl ether acetate (PMA). The polymer as component (D) is Polycizer W-230-H (Mw=1,800) or W-2050 (Mw=3,900) from DIC Corp., ADK Cizer P-300 (Mw=4,900) from Adeka Corp., D645 (Mw=5,600) from J-Plus Co., Ltd., or Polymer A. It is noted that component (D) was confirmed to dissolve in aqueous alkaline solution by spin coating each polymer alone onto a Si substrate of diameter 200 mm and immersing in a 2.38 wt % TMAH aqueous solution.

The structure of Polymers 1 to 4 and components (E) to (K) in Table 1 are identified below.

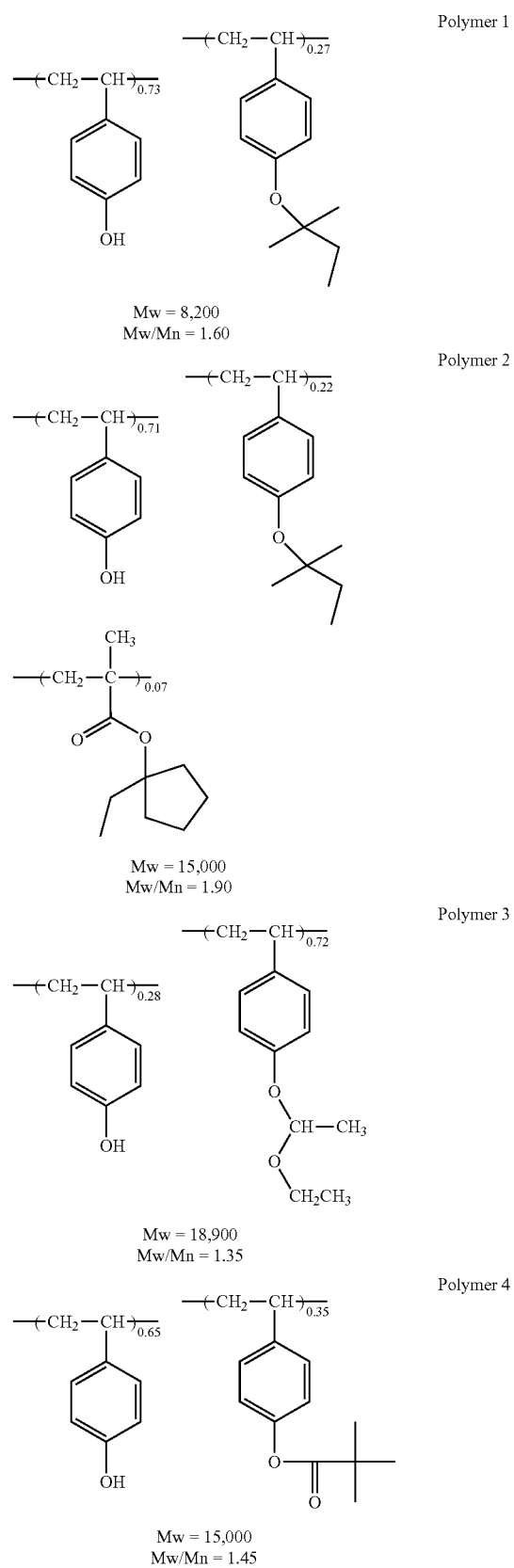

(E) Benzotriazole Compound
BTA: benzotriazole by Kanto Kagaku Co., Ltd.

(F) Imidazole Compound
2E4MZ: 2-ethyl-4-methylimidazole by Shikoku Chemicals Corp.
(G) Basic Compound
TEA: triethanolamine by Kanto Kagaku Co., Ltd.
(H) Polyvinyl Ether Resin
LA25: Lutonal A25 by BASF AG
LM40: Lutonal M40 by BASF AG
(I) Dissolution Accelerator
DP1: EP6050G novolak resin by Asahi Yukizai Corp.
DP2: TrisP-Pa low-nucleus phenol compound by Honshu Chemical Industry Co., Ltd.
(J) Carboxylic Acid
OA: oxalic acid by Kanto Kagaku Co., Ltd.
BA: benzoic acid by Kanto Kagaku Co., Ltd.
(K) Surfactant
S-1: X-70-093 by Shin-Etsu Chemical Co., Ltd.

TABLE 2

|   | Composition | Oven temperature (° C.) | Residual solvent (%) |
|---|---|---|---|
| Example | 1 Composition 1 | 60 | 28 |
|  | 2 Composition 2 | 80 | 14 |
|  | 3 Composition 3 | 70 | 20 |
|  | 4 Composition 4 | 100 | 8 |
|  | 5 Composition 5 | 110 | 5 |
|  | 6 Composition 6 | 80 | 16 |
|  | 7 Composition 7 | 110 | 4 |
|  | 8 Composition 8 | 90 | 12 |
|  | 9 Composition 9 | 105 | 6 |
|  | 10 Composition 10 | 90 | 10 |
|  | 11 Composition 11 | 110 | 6 |
|  | 12 Composition 12 | 90 | 13 |
| Comparative Example | 1 Composition 13 | 110 | 5 |
|  | 2 Composition 14 | 100 | 9 |
|  | 3 Composition 15 | 80 | 15 |
|  | 4 Composition 1 | 50 | 38 |
|  | 5 Composition 2 | 130 | 2 |

TABLE 1

| Composition |  | (A) | (B) | (C) | (D) | (E) | (F) | (G) | (H) | (I) | (J) | (K) |
|---|---|---|---|---|---|---|---|---|---|---|---|---|
| Composition | 1 | Polymer 1 (100) | PAG-2 (1.0) | CP (100) | W-2050 (50) | — | — | — | — | — | — | — |
|  | 2 | Polymer 1 (100) | PAG-2 (2.0) | PMA (50) CP (50) | W-230-H (30) | BTA (0.03) | — | — | LA25 (30) | — | — | S-1 (0.05) |
|  | 3 | Polymer 1 (100) | PAG-1 (0.5) | PMA (100) | P-300 (50) | — | — | TEA (0.10) | — | DP1 (30) | — | — |
|  | 4 | Polymer 2 (100) | PAG-1 (1.0) | PMA (50) EL (50) | D645 (30) | — | — | — | — | — | OA (0.10) | S-1 (0.05) |
|  | 5 | Polymer 2 (100) | PAG-2 (1.0) | CP (100) | W-2050 (80) | — | 2E4MZ (0.05) | — | — | — | — | — |
|  | 6 | Polymer 2 (100) | PAG-2 (1.5) | PMA (50) CP (50) | P-300 (50) | BTA (0.10) | — | TEA (0.10) | — | DP2 (20) | BA (0.05) | — |
|  | 7 | Polymer 3 (100) | PAG-1 (2.0) | PMA (50) EL (50) | W-230-H (100) | — | — | — | LM40 (50) | — | OA (0.03) | S-1 (0.10) |
|  | 8 | Polymer 3 (100) | PAG-1 (1.5) | PMA (50) EL (50) | D645 (100) | BTA (0.05) | — | TEA (0.05) | — | DP2 (20) | — | S-1 (0.05) |
|  | 9 | Polymer 3 (100) | PAG-2 (1.0) | PMA (50) CP (50) | D645 (20) | — | — | TEA (0.15) | — | — | — | — |
|  | 10 | Polymer 1 (100) | PAG-2 (1.0) | PMA (50) CP (50) | Polymer A (50) | — | — | — | — | — | — | — |
|  | 11 | Polymer 4 (100) | PAG-1 (1.0) | PMA (100) | D645 (50) | BTA (0.05) | — | — | LA25 (50) | — | — | S-1 (0.05) |
|  | 12 | Polymer 4 (100) | PAG-2 (1.5) | PMA (50) CP (50) | Polymer A (100) | — | 2E4MZ (0.03) | TEA (0.05) | — | — | — | S-1 (0.05) |
|  | 13 | Polymer 1 (100) | PAG-1 (1.0) | PMA (50) EL (50) | — | — | — | TEA (0.10) | LM40 (100) | — | — | S-1 (0.05) |
|  | 14 | Polymer 2 (100) | PAG-1 (2.0) | PMA (50) EL (50) | — | — | — | — | — | DP1 (100) | — | S-1 (0.05) |
|  | 15 | Polymer 3 (100) | PAG-2 (1.5) | PMA (50) CP (50) | — | BTA (0.10) | — | — | — | — | — | — |

At the end of preparation, the resist solution was filtered through a membrane filter having a pore size of 1.0 μm. In a clean room at a cleanness class of 1,000, a temperature of 22-26° C. and a humidity of 40-45%, the resist solution was coated onto a PET film of 38 μm thick as the thermoplastic film by means of a die coater as the film coater, and dried in a hot air circulating oven at the temperature shown in Table 2 for 5 minutes, yielding a chemically amplified positive resist film laminate.

A PET film of 50 μm thick as the protective film was bonded to the surface of the chemically amplified positive resist film under a pressure of 1 MPa. A content of organic solvent in the positive resist film was determined by sampling a 0.1 g portion of the positive resist film from the film laminate, extraction with 10 ml of acetonitrile, centrifugation, collecting the supernatant, and GC analysis. The resist film in Examples retained the organic solvent in the amount shown in Table 2 during holding at 23° C. for 7 days.

Next, the protective film was peeled from the chemically amplified positive resist film laminate. Using a vacuum laminator (TEAM-300M, Takatori Co., Ltd.) whose vacuum chamber was set at a vacuum of 80 Pa, the resist film on the thermoplastic film was transferred to a Cu substrate of diameter 300 mm having steps of 50 m at the maximum. The temperature was 60° C. With the chamber restored to atmospheric pressure, the substrate was taken out of the laminator, and the thermoplastic film was peeled off. The resist film-bearing substrate was observed under an optical microscope (by Nikon Corp.) to inspect any bubbles on the substrate. For each of Examples and Comparative Examples, the test was performed 5 times, and an average was calculated and used for judgment. The film was judged good (◯) for no bubbles, mediocre (Δ) for 1 to 10 bubbles on the average, and poor (X) for 11 or more bubbles on the average. The results are shown in Table 3.

TABLE 3

|  |  | Bubble formation |
|---|---|---|
| Example | 1 | ◯ |
|  | 2 | ◯ |
|  | 3 | ◯ |
|  | 4 | ◯ |
|  | 5 | ◯ |
|  | 6 | ◯ |
|  | 7 | ◯ |
|  | 8 | ◯ |
|  | 9 | ◯ |
|  | 10 | ◯ |
|  | 11 | ◯ |
|  | 12 | ◯ |
| Comparative Example | 1 | X |
|  | 2 | X |
|  | 3 | Δ |
|  | 4 | Δ |
|  | 5 | X |

Each of the chemically amplified positive resist film laminates prepared in Examples 1 to 12 was wound on an ABS core having an outer diameter of 84.2 mm and an inner diameter of 76.2 mm at a winding force of 20 N and a winding speed of 5 m/min over a length of 30 m and held in the roll form for 24 hours. The laminate was then unwound from the roll, and the resist film was visually observed to inspect whether or not the film cracked. The film was judged good (◯) for no cracks, mediocre (Δ) when one or more cracks were found in a peripheral portion of the film that extends 10 mm from the film edge, and poor (X) when one or more cracks were found inside the 10 mm peripheral portion of the film. The results are shown in Table 4.

TABLE 4

|  |  | Roll crack test |
|---|---|---|
| Example | 1 | ◯ |
|  | 2 | ◯ |
|  | 3 | ◯ |
|  | 4 | ◯ |
|  | 5 | Δ |
|  | 6 | ◯ |
|  | 7 | Δ |
|  | 8 | ◯ |
|  | 9 | Δ |
|  | 10 | ◯ |
|  | 11 | Δ |
|  | 12 | ◯ |

Example 13

The resist film was transferred from the chemically amplified positive resist film laminate of Example 2 to a Cu substrate as above, and soft-baked on a hotplate at 100° C. for 5 minutes. The resist film as soft-baked had a thickness of 60 m as measured by an optical interference film thickness measurement system (M6100 by Nanometrics Inc.). Using an i-line stepper (NSR-2205i11D by Nikon Corp.), the resist film was exposed through a reticle, baked (PEB) at 110° C. for 90 seconds, puddle developed in a 2.38 wt % TMAH aqueous solution for 300 seconds, rinsed with pure water, and dried.

The resulting pattern was observed under a scanning electron microscope (S-4700 by Hitachi High-Technologies Corp.), finding that a 20 μm hole pattern of a rectangular profile was resolved in an exposure dose of 400 mJ/cm$^2$.

After the pattern formation, the surface of the resist pattern-bearing substrate was treated with an oxygen plasma by operating a dry etching system (DEM-451, Nichiden Anelva Co., Ltd.) at 100 W for 30 seconds, to effect ashing. The substrate was immersed in a copper plating bath (Microfab Cu200, Tanaka Precious Metals K.K.), where electroplating of copper was carried out by a constant current flow at 25° C. for 20 minutes, depositing a copper layer of about 20 μm thick. After plating, the surface was washed with flowing deionized water. The resist surface was observed under an optical microscope. The resist film was examined for deformation and cracking by growth stress of plating. With respect to crack resistance, 900 points or crack-sensitive corners on a resist pattern as shown in FIG. 1 were inspected. No cracks were found, indicating that the sample had plating resistance. In FIG. 1, 1 designates a crack inspecting area which includes 6×5=30 points for a size of 50 μm within one shot, indicating that on the entire wafer surface (30 shots, shown left), 30×30=900 points were inspected; 2 is an enlarged view of pattern features; and 3 is a plan view of the entire wafer.

Japanese Patent Application No. 2016-227532 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:
1. A chemically amplified positive resist film laminate comprising a thermoplastic film and a chemically amplified positive resist film thereon,
the chemically amplified positive resist film comprising (A) a base resin comprising a polymer having a hydroxyphenyl group and a protective group on side chain, the polymer turning alkali soluble as a result of the protective group being eliminated under the action of acid, (B) a photoacid generator, (C) 3 to 30% by weight of an organic solvent, and (D) a polymer having an ester bond in its backbone, the resist film being able to be transferred to another support,
wherein the amount of component (D) is 10 to 100 parts by weight per 100 parts by weight of component (A), the polymer (D) has a Mw of 700 to 50,000, and the resist film has a thickness of 5 to 250 μm.
2. The laminate of claim 1 wherein component (D) is the condensation reaction product of a polyfunctional carboxylic acid with a polyhydric alcohol.
3. The laminate of claim 2 wherein the polyfunctional carboxylic acid is an aliphatic carboxylic acid.
4. A pattern forming process comprising the steps of:
(1) transferring the chemically amplified positive resist film of the laminate of claim 1 to another support,
(2) exposing the resist film to radiation of wavelength 230 to 500 nm, and
(3) developing the resist film in an aqueous alkaline solution.

5. The process of claim 4, further comprising the step (4) of forming a metal plating on the support by electroplating or electroless plating, subsequent to the step (3).

6. The process of claim 5, further comprising the step (1') of prebaking the resist film between steps (1) and (2).

7. The laminate of claim 1 wherein the polymer (A) comprises recurring units derived from hydroxystyrene or derivative thereof in which some hydrogen atoms of phenolic hydroxyl groups are substituted by acid labile groups.

* * * * *